(12) United States Patent
Wang et al.

(10) Patent No.: US 12,307,964 B2
(45) Date of Patent: May 20, 2025

(54) PIXEL DRIVING CIRCUIT AND DRIVING METHOD THEREOF, DISPLAY PANEL, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhu Wang, Beijing (CN); Ling Shi, Beijing (CN)

(73) Assignees: CHENGDU BOE OPTOELECTRONICS TECHNOLOGY CO., LTD., Sichuan (CN); BOE TECHNOLOGIES GROUP CO., LTD., Beijing (CN)

( * ) Notice: Subject to any disclaimer, the term of this patent is extended or adjusted under 35 U.S.C. 154(b) by 0 days.

(21) Appl. No.: 17/914,386

(22) PCT Filed: Sep. 8, 2021

(86) PCT No.: PCT/CN2021/117152
§ 371 (c)(1),
(2) Date: Sep. 26, 2022

(87) PCT Pub. No.: WO2023/035141
PCT Pub. Date: Mar. 16, 2023

(65) Prior Publication Data
US 2024/0386844 A1 Nov. 21, 2024

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC .................................................. G09G 3/3233
See application file for complete search history.

(56) References Cited

U.S. PATENT DOCUMENTS 7,944,418 B2   5/2011   Chung et al.
9,704,433 B2   7/2017   Kim
(Continued)

FOREIGN PATENT DOCUMENTS

CN    1909042 A    2/2007
CN    104715712 A    6/2015
(Continued)

OTHER PUBLICATIONS

Written Opinion from PCT/CN2021/117152 dated May 18, 2022.

*Primary Examiner* — William Boddie
*Assistant Examiner* — Alecia D English
(74) *Attorney, Agent, or Firm* — Calfee, Halter & Griswold LLP

(57) ABSTRACT

The present disclosure relates to a pixel driving circuit and a driving method thereof, a display panel, and a display device, the pixel driving circuit includes: a driving circuit, a control circuit, a first reset circuit, and a second reset circuit and a coupling circuit. The driving circuit, the control circuit, the first reset circuit and the second reset circuit all include transistors, the transistors in the driving circuit, the control circuit, the first reset circuit and the second reset circuit are all N-type transistors, the transistors in the first reset circuit are at least partially oxide transistors, and the transistors in the second reset circuit are at least partially the oxide transistors.

19 Claims, 20 Drawing Sheets

(52) U.S. Cl.
CPC ............... *G09G 2300/0819* (2013.01); *G09G 2300/0842* (2013.01); *G09G 2300/0861* (2013.01); *G09G 2310/08* (2013.01); *G09G 2320/0223* (2013.01); *G09G 2320/0233* (2013.01)

(56) References Cited

U.S. PATENT DOCUMENTS

| | | | |
|---|---|---|---|
| 9,947,269 B2 | 4/2018 | Jung et al. | |
| 10,340,472 B2 | 7/2019 | Kim et al. | |
| 10,490,128 B1 | 11/2019 | Qian et al. | |
| 10,665,169 B2 | 5/2020 | Chang | |
| 10,673,008 B2 | 6/2020 | Kim et al. | |
| 10,790,467 B2 | 9/2020 | Kim et al. | |
| 10,854,837 B2 | 12/2020 | Kim et al. | |
| 10,923,032 B2 | 2/2021 | Qing | |
| 11,069,297 B2 | 7/2021 | Qing | |
| 11,094,266 B2 | 8/2021 | Heo et al. | |
| 2007/0024544 A1 | 2/2007 | Chung et al. | |
| 2016/0180775 A1 | 6/2016 | Kim | |
| 2016/0351122 A1 | 12/2016 | Jung et al. | |
| 2017/0294503 A1 | 10/2017 | Kim et al. | |
| 2018/0069190 A1 | 3/2018 | Kim et al. | |
| 2018/0144684 A1 | 5/2018 | Jeon et al. | |
| 2019/0130832 A1 | 5/2019 | Chang | |
| 2019/0228706 A1* | 7/2019 | Umeda | G09G 3/3258 |
| 2019/0326543 A1 | 10/2019 | Kim et al. | |
| 2019/0333446 A1 | 10/2019 | Yin | |
| 2019/0371237 A1 | 12/2019 | Qian et al. | |
| 2020/0035164 A1 | 1/2020 | Qing | |
| 2020/0105193 A1 | 4/2020 | Qing | |
| 2020/0160795 A1 | 5/2020 | Heo et al. | |
| 2020/0227668 A1 | 7/2020 | Kim et al. | |
| 2020/0328369 A1 | 10/2020 | Kim et al. | |
| 2020/0410934 A1 | 12/2020 | Jeon | |
| 2021/0074943 A1 | 3/2021 | Kim et al. | |
| 2021/0074944 A1 | 3/2021 | Kim et al. | |
| 2022/0310007 A1* | 9/2022 | Zhou | G09G 3/3233 |
| 2022/0310016 A1* | 9/2022 | Yang | G09G 3/3266 |
| 2023/0063266 A1* | 3/2023 | Nie | G09G 3/3258 |

FOREIGN PATENT DOCUMENTS

| | | |
|---|---|---|
| CN | 104867442 A | 8/2015 |
| CN | 106205486 A | 12/2016 |
| CN | 104867442 B | 10/2017 |
| CN | 107799535 A | 3/2018 |
| CN | 108269531 A | 7/2018 |
| CN | 108597453 A | 9/2018 |
| CN | 108877674 A | 11/2018 |
| CN | 109949743 A | 6/2019 |
| CN | 108269351 B | 8/2019 |
| CN | 110827757 A | 2/2020 |
| CN | 111210784 A | 5/2020 |
| CN | 111613180 A | 9/2020 |
| CN | 111710303 A | 9/2020 |
| CN | 112133253 A | 12/2020 |
| CN | 112436504 A | 3/2021 |
| EP | 1758085 A2 | 2/2007 |
| EP | 1758085 A3 | 9/2007 |
| EP | 1758085 B1 | 2/2012 |
| EP | 3098805 A1 | 11/2016 |
| EP | 3098805 B1 | 7/2018 |
| EP | 3477625 A1 | 5/2019 |
| GB | 2575911 A | 1/2020 |
| GB | 2575911 B | 9/2021 |

\* cited by examiner

PIXEL DRIVING CIRCUIT AND DRIVING METHOD THEREOF, DISPLAY PANEL, AND DISPLAY DEVICE

CROSS REFERENCE

The present application is the 371 application of PCT Application No. PCT/CN2021/117152, filed on Sep. 8, 2021, the entire contents of which are incorporated herein by reference.

TECHNICAL FIELD

The present disclosure relates to the field of display technologies, and in particular, to a pixel driving circuit and a driving method thereof, a display panel, and a display device.

BACKGROUND

In the related art, pixel driving circuits can be formed using Low temperature polycrystalline TFT+Oxide TFT (LTPO) technologies. The LTPO technologies form the pixel driving circuits by combining N-type oxide transistors and P-type low-temperature polycrystalline silicon transistors.

It should be noted that the information disclosed in the Background section above is only for enhancing the understanding of the background of the present disclosure, and thus may include information that does not constitute prior art known to those of ordinary skill in the art.

SUMMARY

According to an aspect of the present disclosure, there is provided a pixel driving circuit, wherein the pixel driving circuit includes: a driving circuit, a control circuit, a first reset circuit, a second reset circuit, and a coupling circuit. The driving circuit is coupled to a first node, a second node and a third node, and is configured to input a driving current to the third node through the second node according to a signal of the first node. The control circuit is coupled to a first power terminal, the second node, the third node, a fourth node and an enable signal terminal, and is configured to communicate the first power terminal with the second node in response to a signal of the enable signal terminal, and communicate the third node with the fourth node in response to the signal of the enable signal terminal. The first reset circuit is coupled to the fourth node, a reset signal terminal and an initial signal terminal, and is configured to transmit a signal of the initial signal terminal to the fourth node in response to a signal of the reset signal terminal. The second reset circuit is coupled to the first node, the first power terminal and the reset signal terminal, and is configured to transmit a signal of the first power terminal to the first node in response to the signal of the reset signal terminal. The coupling circuit is coupled between the first node and the fourth node; wherein, the driving circuit, the control circuit, the first reset circuit, and the second reset circuit all include transistors, the transistors in the driving circuit, the control circuit, the first reset circuit and the second reset circuit are all N-type transistors, the transistors in the first reset circuit are at least partially oxide transistors, and the transistors in the second reset circuit are at least partially the oxide transistors.

According to an aspect of the present disclosure, there is provided a driving method for a pixel driving circuit, configured to drive the pixel driving circuit described above, wherein the driving method includes:
in a reset stage, inputting an active level to the reset signal terminal, and inputting an inactive level to the enable signal terminal; and
in a light-emitting stage, inputting the inactive level to the reset signal terminal, and inputting the active level to the enable signal terminal.

According to an aspect of the present disclosure, there is provided a driving method for a pixel driving circuit, configured to drive the pixel driving circuit described above, wherein the driving method includes:
in a reset stage, inputting an active level to the reset signal terminal, and inputting an inactive level to the enable signal terminal and the gate driving signal terminal; and
in a threshold compensation stage, inputting the active level to the gate driving signal terminal, and inputting the inactive level to the reset signal terminal and the enable signal terminal; and
in a light-emitting stage, inputting the inactive level to the reset signal terminal and the gate driving signal terminal, and inputting the active level to the enable signal terminal.

According to an aspect of the present disclosure, there is provided a display panel, wherein the display panel includes the pixel driving circuit described above.

According to an aspect of the present disclosure, there is provided a display panel, wherein the display panel includes a light-emitting unit and a pixel driving circuit configured to drive the light-emitting unit, and the pixel driving circuit includes a driving transistor, a first transistor, a second transistor, a fourth transistor, a fifth transistor, a sixth transistor, a seventh transistor and a capacitor. A first electrode of the first transistor is coupled to an initial signal line, and a second electrode of the first transistor is coupled to a first electrode of the light-emitting unit; a first electrode of the second transistor is coupled to a power line, and a second electrode of the second transistor is coupled to a gate of the driving transistor; a gate of the fifth transistor is coupled to an enable signal line, a first electrode of the fifth transistor is coupled to the power line, and a second electrode of the fifth transistor is coupled to a first electrode of the driving transistor; a gate of the sixth transistor is coupled to the enable signal line, a first electrode of the sixth transistor is coupled to a second electrode of the driving transistor, and a second electrode of the sixth transistor is coupled to a first electrode of the light-emitting unit; a gate of the fourth transistor is coupled to a gate driving signal line, a first electrode of the fourth transistor is coupled to a data line, and a second electrode of the fourth transistor is coupled to the first electrode of the driving transistor; a gate of the seventh transistor is coupled to the gate driving signal line, a first electrode of the seventh transistor is coupled to the gate of the driving transistor, and a second electrode of the seventh transistor is coupled to the second electrode of the driving transistor; and a first electrode of the capacitor is coupled to the gate of the driving transistor, and a second electrode of the capacitor is coupled to the second electrode of the sixth transistor. The driving transistor, the first transistor, the second transistor, the fifth transistor, the sixth transistor, the fourth transistor, and the seventh transistor are N-type transistors, and the first transistor and the second transistor are oxide transistors.

According to an aspect of the present disclosure, there is provided a display device including the display panel described above.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments consistent with the present disclosure, and are used together with the specification to explain principles of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
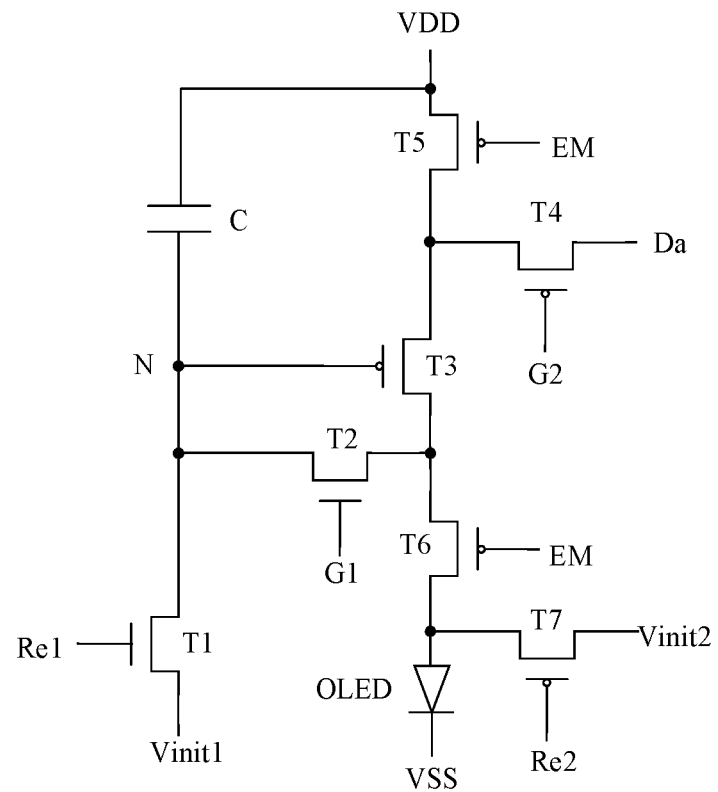
FIG. 1 is a schematic diagram of a circuit structure of a pixel driving circuit in the related art.

Embodiments will now be described more fully with reference to the drawings. However, the embodiments can be implemented in a variety of forms and should not be construed as being limited to examples set forth herein; rather, these embodiments are provided so that the present disclosure will be more complete and full so as to convey the idea of the embodiments to those skilled in this art. The same reference numerals in the drawings denote the same or similar structures, and the repeated description thereof will be omitted.

The terms "one", "a" and "the" are used to indicate that there are one or more elements/components or the like; and the terms "include" and "have" are used to indicate an open meaning of including and means that there may be additional elements/components/etc. in addition to the listed elements/components/etc.

FIG. 1 is a schematic diagram of a circuit structure of a pixel driving circuit in the related art, and as shown in FIG. 1, the pixel driving circuit may include a driving transistor T3, a first transistor T1, a second transistor T2, a fourth transistor T4, a fifth transistor T5, a sixth transistor T6, a seventh transistor T7 and a capacitor C. A first electrode of the fourth transistor T4 is coupled to a data signal terminal Da, a second electrode of the fourth transistor T4 is coupled to a first electrode of the driving transistor T3, and a gate of the fourth transistor T4 is coupled to a gate driving signal terminal G2. A first electrode of the fifth transistor T5 is coupled to a first power terminal VDD, a second electrode of the fifth transistor T5 is coupled to the first electrode of the driving transistor T3, and a gate of the fifth transistor T5 is coupled to an enable signal terminal EM. A gate of the driving transistor T3 is coupled to a node N. A first electrode of the second transistor T2 is coupled to the node N, a second electrode of the second transistor T2 is coupled to a second electrode of the driving transistor T3, and a gate of the second transistor T2 is coupled to a gate driving signal terminal G1. A first electrode of the sixth transistor T6 is coupled to the second electrode of the driving transistor T3, a second electrode of the sixth transistor T6 is coupled to a first electrode of the seventh transistor T7, and a gate of the sixth transistor T6 is coupled to the enable signal terminal EM. A second electrode of the seventh transistor T7 is coupled to a second initial signal terminal Vinit2, and a gate of the seventh transistor T7 is coupled to a second reset signal terminal Re2. A first electrode of the first transistor T1 is coupled to the node N, a second electrode of the first transistor T1 is coupled to a first initial signal terminal Vinit1, and a gate of the first transistor T1 is coupled to a first reset signal terminal Re1. The capacitor C is coupled between the first power terminal VDD and the node N. The pixel driving circuit may be coupled to a light-emitting unit OLED for driving the light-emitting unit OLED to emit light. The light-emitting unit OLED may be coupled between the second electrode of the sixth transistor T6 and a second power terminal VSS. The first transistor T1 and the second transistor T2 may be N-type transistors, for example, the first transistor T1 and the second transistor T2 may be N-type metal oxide transistors, which have a relatively small leakage current, so that the electric leakage of the node N through the first transistor T1 and the second transistor T2 in a light-emitting stage can be avoided. Meanwhile, the driving transistor T3, the fourth transistor T4, the fifth transistor T5, the sixth transistor T6 and the seventh transistor T7 may be P-type transistors, for example, the driving transistor T3, the fourth transistor T4, the fifth transistor T5, the sixth transistor T6 and the seventh transistor T7 can be P-type low-temperature polycrystalline silicon transistors, which have a relatively high carrier mobility, so as to facilitate to achieve a display panel with high resolution, high response speed, high pixel density and high aperture ratio. The first initial signal terminal and the second initial signal terminal may output the same or different voltage signals according to actual conditions.

Figure 2:
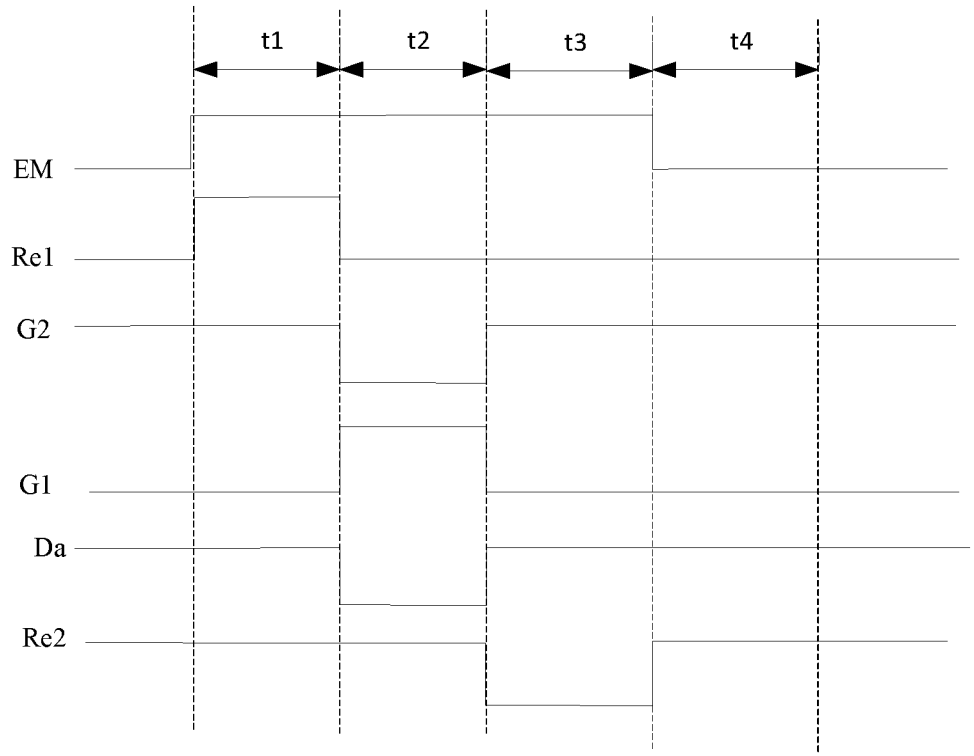
FIG. 2 is a timing diagram of each node in a driving method for the pixel driving circuit of FIG. 1.

FIG. 2 is a timing diagram of each node in a driving method for the pixel driving circuit of FIG. 1, and as shown in FIG. 2, G1 represents a timing of the gate driving signal terminal G1, G2 represents a timing of the gate driving signal terminal G2, Re1 represents a timing of the first reset signal terminal Re1, Re2 represents a timing of the second reset signal terminal Re2, EM represents a timing of the enable signal terminal EM, and Da represents a timing of the data signal terminal Da. The driving method for the pixel driving circuit may include a first reset stage t1, a compensation stage t2, a second reset stage t3 and a light-emitting stage t4. In the first reset stage t1, the first reset signal terminal Re1 outputs a high-level signal, the first transistor T1 is turned on, and the first initial signal terminal Vinit1 inputs an initial signal to the node N. In the compensation stage t2, the gate driving signal terminal G1 outputs the high-level signal, the gate driving signal terminal G2 outputs a low-level signal, the fourth transistor T4 and the second transistor T2 are turned on, and the data signal terminal Da outputs a driving signal to write a voltage Vdata+Vth to the node N at the same time, where Vdata is a voltage of the driving signal, and Vth is a threshold voltage of the driving transistor T3. In the second reset stage t3, the second reset signal terminal Re2 outputs the low-level signal, the seventh transistor T7 is turned on, and the second initial signal terminal Vinit2 inputs the initial signal to the second electrode of the sixth transistor T6. In the light-emitting stage t4, the enable signal terminal EM outputs the low-level signal, the sixth transistor T6 and the fifth transistor T5 are turned on, and the driving transistor T3 emits the light under the action of the voltage Vdata+Vth stored in the capacitor C. According to an output current formula of the driving transistor $I=(\mu W Cox/2L)(Vgs-Vth)^2$, where $\mu$ is a carrier mobility, Cox is a gate capacitance per unit area, W is a width of a channel of the driving transistor, L is a length of the channel of the driving transistor, Vgs is a gate-source voltage difference of the driving transistor, and Vth is the threshold voltage of the driving transistor, an output current of the driving transistor in the pixel driving circuit of the present disclosure is $I=(\mu W Cox/2L)(Vdata+Vth-Vdd-Vth)^2$, and in this pixel driving circuit, an influence of the threshold of the driving transistor on its output current can be avoided.

However, the display panel adopting the pixel driving circuit shown in FIG. 1 needs to provide two groups of gate driving circuits to respectively supply gate driving signals to the N-type transistors (e.g., the first transistor T1 and the second transistor T2) and the P-type transistors (e.g., the fourth transistor T4, the fifth transistor T5, the sixth transistor T6 and the seventh transistor T7) in the pixel driving circuit. In addition, a driving current output by the pixel driving circuit in FIG. 1 is related to a voltage of the first power terminal Vdd, and the first power terminal is provided by a power line located on the display panel. However, because the power line itself has an IR-drop, power lines at different positions on the display panel have different voltages, resulting in uneven display of the display panel under the same gray scale.

Figure 3:
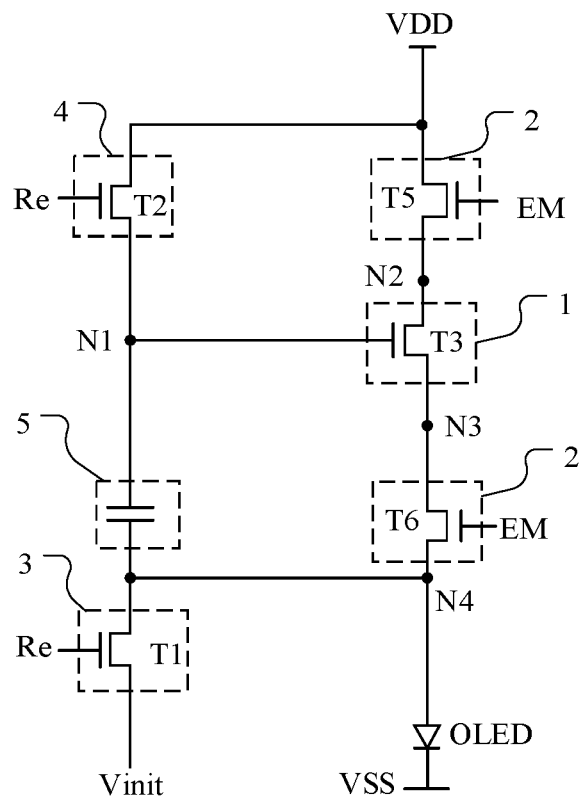
FIG. 3 is a schematic structural diagram of an embodiment of a pixel driving circuit of the present disclosure.

In view of this, an embodiment of the present disclosure provides a pixel driving circuit. FIG. 3 is a schematic structural diagram of an embodiment of a pixel driving circuit of the present disclosure, and as shown in FIG. 3, the pixel driving circuit may include a driving circuit 1, a control circuit 2, a first reset circuit 3, a second reset circuit 4, and a coupling circuit 5. The driving circuit 1 may be coupled to a first node N1, a second node N2 and a third node N3, and may be configured to input a driving current to the third node N3 through the second node N2 according to a signal of the first node N1. The control circuit 2 may be coupled to a first power terminal VDD, the second node N2, the third node N3, a fourth node N4 and an enable signal terminal EM, and may be configured to communicate the first power terminal VDD with the second node N2 in response to a signal of the enable signal terminal EM, and communicate the third node N3 with the fourth node N4 in response to the signal of the enable signal terminal EM. The first reset circuit 3 may be coupled to the fourth node N4, a reset signal terminal Re and an initial signal terminal Vinit, and may be configured to transmit a signal of the initial signal terminal Vinit to the fourth node N4 in response to a signal of the reset signal terminal Re. The second reset circuit 4 may be coupled to the first node N1, the first power terminal VDD and the reset signal terminal Re, and may be configured to transmit a signal of the first power terminal VDD to the first node N1 in response to the signal of the reset signal terminal Re. The coupling circuit 5 may be coupled between the first node N1 and the fourth node N4. The driving circuit 1, the control circuit 2, the first reset circuit 3 and the second reset circuit 4 may all include transistors, the transistors in the driving circuit 1, the control circuit 2, the first reset circuit 3 and the second reset circuit 4 are all the N-type transistors, the transistor in the first reset circuit 3 is an oxide transistor, and the transistor in the second reset circuit is the oxide transistor. In the embodiments of the present disclosure, as shown in FIG. 3, the fourth node can be configured to be coupled to the light-emitting unit OLED, and the other end of the light-emitting unit OLED can be coupled to a second power terminal VSS. The pixel driving circuit can drive the light-emitting unit OLED to emit the light, and the light-emitting unit may be a light-emitting diode.

In the embodiments of the present disclosure, on the one hand, the transistors in the driving circuit 1, the control circuit 2, the first reset circuit 3 and the second reset circuit 4 are all the N-type transistors, and the pixel driving circuit can provide the gate driving signal to the transistors in the pixel driving circuit through one group of gate driving circuits. On the other hand, the transistor in the first reset circuit 3 is the oxide transistor, for example, a material of a channel area of the oxide transistor can be indium gallium zinc oxide, and the oxide transistor has a relatively small leakage current, so that a leakage current of the fourth node N4 through the first reset circuit in the light-emitting stage can be reduced; the transistor in the second reset circuit is the oxide transistor, and similarly, this arrangement can reduce a leakage current of the first node N1 through the second reset circuit in the light-emitting stage. On still the other hand, the pixel driving circuit may include a reset stage, a threshold compensation stage and the light-emitting stage; in the reset stage, the first reset circuit 3 can transmit the initial signal of the initial signal terminal Vinit to the fourth node N4 in response to the signal of the reset signal terminal, and writing the initial signal to the fourth node N4 can eliminate carriers that are not recombined on a light-emitting interface inside the light-emitting diode to alleviate the aging of the light-emitting diode, meanwhile, the second reset circuit 4 can transmit the signal of the first power terminal VDD to the first node in response to the signal of the reset signal terminal to reset the first node N1; and in the threshold compensation stage, a correlation quantity related to the data signal and the threshold of the driving transistor T3 can be written to the first node N1, for example, a compensation voltage Vdata+Vth can be written to the first node in the threshold compensation stage, where Vdata is the voltage of the data signal, Vth is the voltage of the driving transistor T3; and in the light-emitting stage, the control circuit can communicate the first power terminal with the second node N2 and communicate the third node N3 with the fourth node N4, in response to the signal of the enable signal terminal, a voltage of the fourth node N4 changes from Vinit to Voled, where Vinit is a voltage of the initial signal, and a voltage of the first node N1 becomes Vdata+Vth+Voled−Vinit under a coupling action of the coupling circuit 5, so that the output current of the driving transistor is I=(μWCox/2L)(Vdata+Vth+Voled−Vinit−Voled−Vth)$^2$=(μWCox/2L)(Vdata−Vinit)$^2$. That is, the output current of the pixel driving circuit is not related to the voltage of the first power terminal VDD, and the display panel adopting the pixel driving circuit will not present the uneven display due to the IR-drop of the power line itself. In addition, in the embodiments of the present disclosure, before the end of the reset stage, the initial signal terminal Vinit may have completed charging the capacitor C. That is, at the end of the reset stage, there is no current on the initial signal line used to provide the initial signal terminal, so that although the initial signal line itself also has an resistance, since there is no current on the initial signal line after the initial signal terminal Vinit writes a voltage to the capacitor C, there will be no IR-drop on the initial signal line. That is, voltages of the initial signal terminal at different positions on the display panel will not be different due to the resistance of the initial signal line itself.

Figure 4:
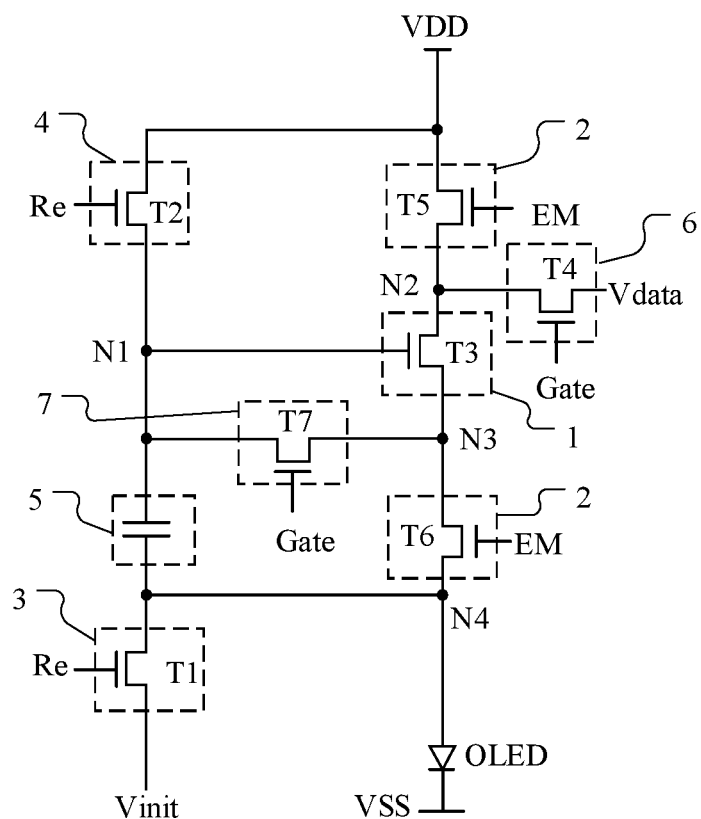
FIG. 4 is a schematic structural diagram of another embodiment of a pixel driving circuit of the present disclosure.

It should be understood that the pixel driving circuit may further include other structures for writing a compensation voltage to the first node N1 in the threshold compensation stage. For example, FIG. 4 is a schematic structural diagram of another embodiment of a pixel driving circuit of the present disclosure, and as shown in FIG. 4, in the embodiments of the present disclosure, the pixel driving circuit may further include a data writing circuit 6 and a threshold compensation circuit 7. The data writing circuit 6 may be coupled to the second node N2, a data signal terminal Vdata and a gate driving signal terminal Gate, and may be configured to transmit a signal of the data signal terminal Vdata to the second node N2 in response to a signal of the gate driving signal terminal Gate. The threshold compensation circuit 7 may be coupled to the third node N3, the first node N1 and the gate driving signal terminal Gate, and may be configured to communicate the first node N1 with the third node N3 in response to the signal of the gate driving signal terminal Gate. The data writing circuit 6 and the threshold compensation circuit 7 both include the transistors, and the transistors in the data writing circuit 6 and the threshold compensation circuit 7 are all the N-type transistors. The transistors in the data writing circuit 6 and the threshold compensation circuit 7 may share a group of gate driving circuits with the transistors in the control circuit 2, the first reset circuit 3 and the second reset circuit 4. In the threshold compensation stage, the data writing circuit 6 may respond to the signal of the gate driving signal terminal Gate to transmit the signal of the data signal terminal Vdata to the second node N2, and the threshold compensation circuit 7 may respond to the signal of the gate driving signal terminal Gate to communicate the first node N1 with the third node N3, so that the voltage Vdata+Vth can be written to the first node, where Vdata is the voltage of the data signal, and Vth is the voltage of the driving transistor T3.

In the embodiments of the present disclosure, as shown in FIGS. 3 and 4, the driving circuit 1 may include a driving transistor T3, a gate of the driving transistor T3 is coupled to the first node N1, a first electrode of the driving transistor T3 is coupled to the second node N2, and a second electrode of the driving transistor T3 is coupled to the third node N3. The control circuit 2 may include a fifth transistor T5 and a sixth transistor T6. A gate of the fifth transistor T5 is coupled to the enable signal terminal EM, a first electrode of the fifth transistor T5 is coupled to the first power terminal VDD, and a second electrode of the fifth transistor T5 is coupled to the second node N2. A gate of the sixth transistor T6 is coupled to the enable signal terminal EM, a first electrode of the sixth transistor T6 is coupled to the third node N3, and a second electrode of the sixth transistor T6 is coupled to the fourth node N4. The first reset circuit 3 may include a first transistor T1, a gate of the first transistor T1 is coupled to the reset signal terminal Re, a first electrode of the first transistor T1 is coupled to the initial signal terminal Vinit, and a second electrode of the first transistor T1 is coupled to the fourth node N4. The second reset circuit 4 may include a second transistor T2, a gate of the second transistor T2 is coupled to the reset signal terminal Re, a first electrode of the second transistor T2 is coupled to the first power terminal VDD, and a second electrode of the second transistor T2 is coupled to the first node N1. The coupling circuit may include a capacitor C coupled between the first node and the fourth node. The driving transistor T3, the first transistor T1, the second transistor T2, the fifth transistor T5, and the sixth transistor T6 may be the N-type transistors, and the first transistor T1 and the second transistor T2 may be the oxide transistors, for example, the material of the channel area of the oxide transistor may be indium gallium zinc oxide.

In the embodiments of the present disclosure, as shown in FIG. 4, the data writing circuit 6 may include a fourth transistor T4, a gate of the fourth transistor T4 is coupled to the gate driving signal terminal Gate, a first electrode of the fourth transistor T4 is coupled to the data signal terminal Vdata, and a second electrode of the fourth transistor T4 is coupled to the second node N2. The threshold compensation circuit 7 may include a seventh transistor T7, a gate of the seventh transistor T7 is coupled to the gate driving signal terminal Gate, the first electrode of the seventh transistor T7 is coupled to the first node N1, and the second electrode of the seventh transistor T7 is coupled to the third node N3. The fourth transistor T4 and the seventh transistor T7 may be the N-type transistors.

In the embodiments of the present disclosure, the transistors in the data writing circuit 6, the threshold compensation circuit 7, the control circuit 2 and the driving circuit 1 may be the N-type low-temperature polycrystalline silicon transistors. For example, as shown in FIG. 4, the driving transistor T3, the fourth transistor T4, the fifth transistor T5, the sixth transistor T6 and the seventh transistor T7 may be the N-type low-temperature polycrystalline silicon transistors, which have a relatively high carrier mobility, so as to facilitate to achieve the display panel with the high resolution, high response speed, high pixel density, and high aperture ratio. It should be noted that the first reset circuit 3 may further include the N-type low-temperature polycrystalline silicon transistor, for example, the N-type low-temperature polycrystalline silicon transistor may be arranged in series with the N-type oxide transistor in the first reset circuit 3. Similarly, the second reset circuit 4 may also include the N-type low-temperature polycrystalline silicon transistor arranged in series with the N-type oxide transistor in the second reset circuit 4.

Figure 5:
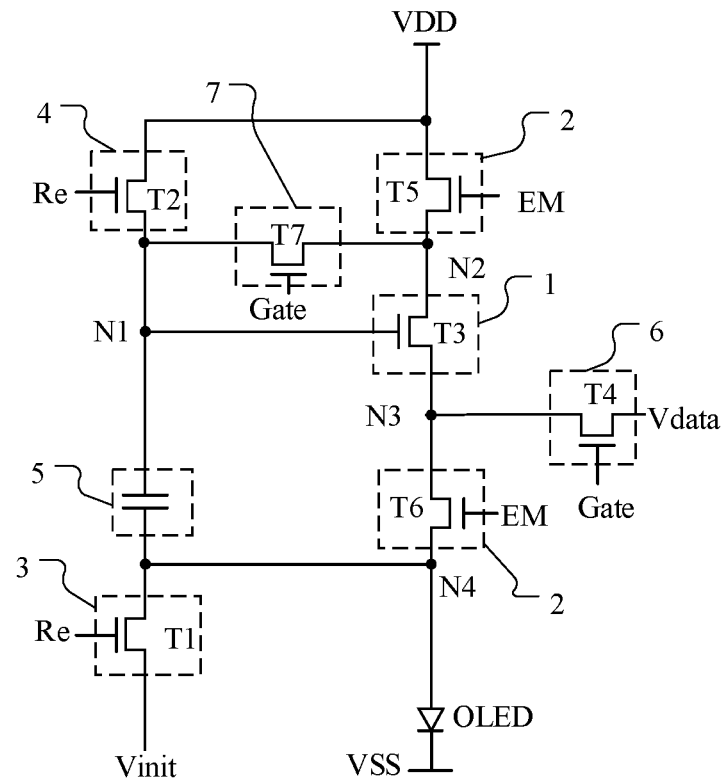
FIG. 5 is a schematic structural diagram of another embodiment of a pixel driving circuit of the present disclosure.

It should be understood that, in other embodiments, the pixel driving circuit may also write the compensation voltage to the first node N1 through other structures. For example, FIG. 5 is a schematic structural diagram of another embodiment of a pixel driving circuit of the present disclosure, and as shown in FIG. 5, the pixel driving circuit may further include the data writing circuit 6 and the threshold compensation circuit 7. The data writing circuit 6 may be coupled to the third node N3, the data signal terminal and the gate driving signal terminal Gate, and may be configured to transmit the signal of the data signal terminal to the third node N3 in response to the signal of the gate driving signal terminal Gate. The threshold compensation circuit 7 is coupled to the second node N2, the first node N1 and the gate driving signal terminal Gate, and is configured to communicate the first node N1 with the second node N2 in response to the signal of the gate driving signal terminal Gate. The data writing circuit 6 and the threshold compensation circuit 7 both include the transistors, and the transistors in the data writing circuit 6 and the threshold compensation circuit 7 are all the N-type transistors. In the threshold compensation stage, the data writing circuit 6 may respond to the signal of the gate driving signal terminal Gate to transmit the signal of the data signal terminal Vdata to the third node N3, and the threshold compensation circuit 7 may respond to the signal of the gate driving signal terminal Gate to communicate the first node N1 with the second node N2, the driving transistor T3 forms a diode structure, so that the voltage Vdata+Vth can be written to the first node, where Vdata is the voltage of the data signal, and Vth is the voltage of the driving transistor T3.

Figure 6A:
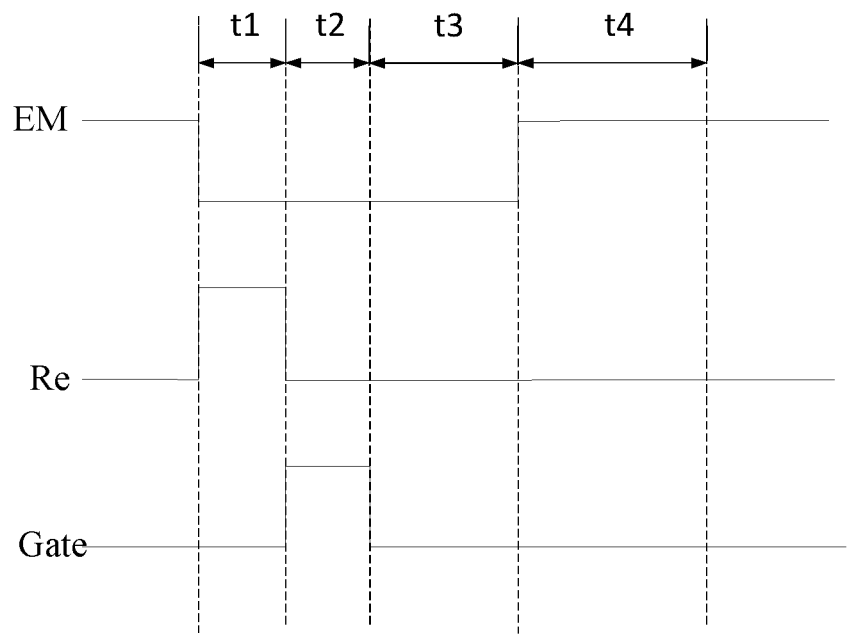
FIG. 6a is a timing diagram of each node of the pixel driving circuit in FIG. 4.

FIG. 6a is a timing diagram of each node of the pixel driving circuit in FIG. 4, and as shown in FIG. 6a, Gate is a timing of the gate driving signal terminal, EM is a timing of the enable signal terminal EM, and Re is a timing of the reset signal terminal. In the embodiments of the present disclosure, the voltage of the first power terminal VDD may be a high-level voltage, and a voltage of the second power terminal VSS may be a low-level voltage. The driving method for the pixel driving circuit may include the reset stage t1, the threshold compensation stage t2, a buffer stage t3 and the light-emitting stage t4. In the reset stage t1, the enable signal terminal EM and the gate driving signal terminal Gate output an inactive level (low level), the reset signal terminal Re outputs an active level (high level), the first transistor T1 and the second transistor T2 are turned on, the high-level signal of the first power terminal VDD is transmitted to the first node N1, and the signal of the initial signal terminal Vinit is transmitted to the fourth node N4. In the threshold compensation stage t2, the enable signal terminal EM and the reset signal terminal Re output the inactive level (low level), the gate driving signal terminal Gate outputs the active level (high level), the fourth transistor T4 and the seventh transistor T7 are turned on, and the data signal terminal Vdata writes the compensation voltage Vdata+Vth to the first node. In the buffer stage t3, the gate driving signal terminal Gate, the enable signal terminal EM and the reset signal terminal Re output the inactive level (low level). In the light-emitting stage t4, the reset signal terminal Re and the gate driving signal terminal Gate output the inactive level (low level), the enable signal terminal EM outputs the active level (high level), the fifth transistor T5 and the sixth transistor T6 are turned on, the voltage of the fourth node N4 changes from Vinit to Voled, where Vinit is the voltage of the initial signal, and the voltage of the first node N1 becomes Vdata+Vth+Voled−Vinit under the coupling action of the capacitor C, so that the output current of the driving transistor is I=($\mu$WCox/2L)(Vdata+Vth+Voled−Vinit−Voled−Vth)$^2$−($\mu$WCox/2L)(Vdata−Vinit)$^2$. That is, the output current of the pixel driving circuit is not related to the voltage of the first power terminal VDD, so that the display panel adopting this pixel driving circuit will not present the uneven display due to the IR-drop of the power line itself. It should be understood that, in other embodiments, the driving method for the pixel driving circuit may not include the buffer stage t3.

Figure 6B:
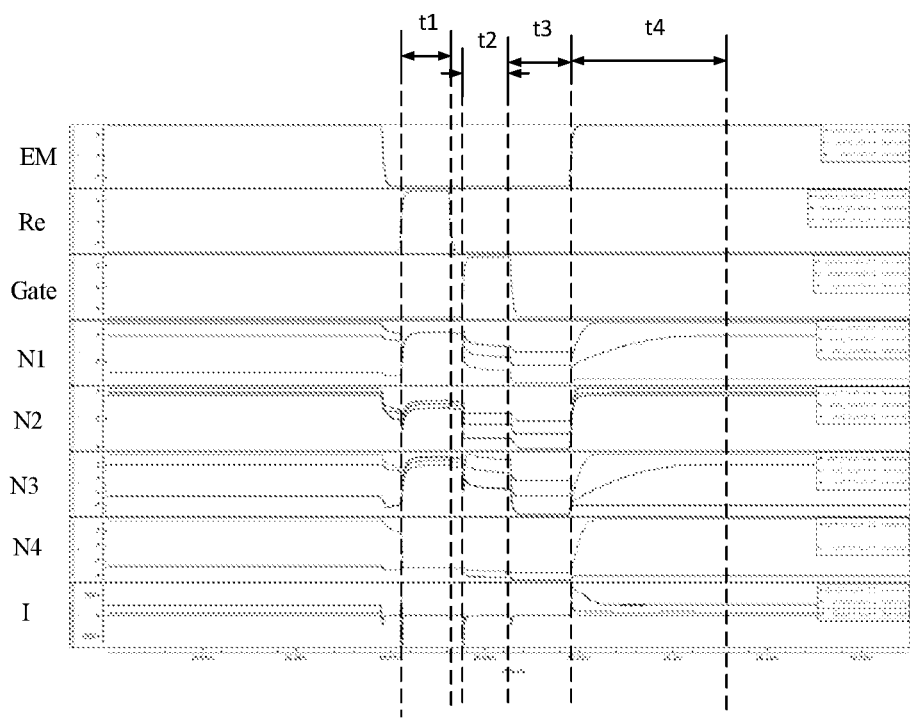
FIG. 6b is a simulation timing diagram of each node of the pixel driving circuit in FIG. 4.

FIG. 6b is a simulation timing diagram of each node of the pixel driving circuit in FIG. 4, and as s shown in FIG. 6b, Gate is the timing of the gate driving signal terminal, EM is the timing of the enable signal terminal EM, Re is the timing of the reset signal terminal, N1 is a timing of the first node, N2 is a timing of the second node, N3 is a timing of the third node, N4 is a timing of the fourth node, and I is the output current of the driving transistor. FIG. 6b shows a timing diagram of each node under three data signals. The driving method for the pixel driving circuit may also include the reset stage t1, the threshold compensation stage t2, the buffer stage t3 and the light-emitting stage t4.

The embodiments of the present disclosure further provide a driving method for a pixel driving circuit, configured to drive the above-mentioned pixel driving circuit. The driving method includes:
- in the reset stage, the active level is input to the reset signal terminal Re, and the inactive level is input to the enable signal terminal EM and the gate driving signal terminal Gate;
- in the threshold compensation stage, the active level is input to the gate driving signal terminal Gate, and the inactive level is input to the reset signal terminal Re and the enable signal terminal EM; and
- in the light-emitting stage, the inactive level is input to the reset signal terminal Re and the gate driving signal terminal Gate, and the active level is input to the enable signal terminal EM.

The driving method for the pixel driving circuit has been described in detail in the above content, and will not be repeated here.

The embodiments of the present disclosure further provide a display panel, and the display panel includes the above-mentioned pixel driving circuit.

Figure 11:
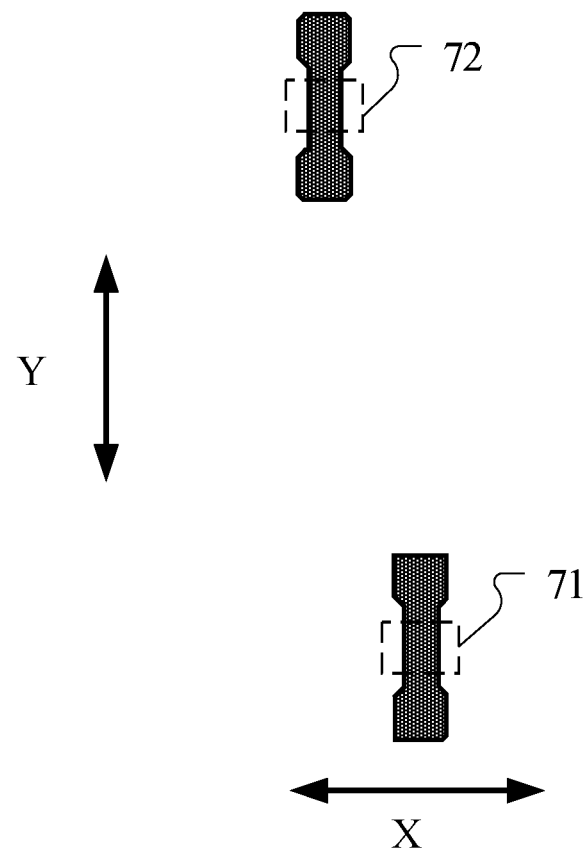
FIG. 11 is a structural layout of a second active layer in FIG. 7.
Figure 12:
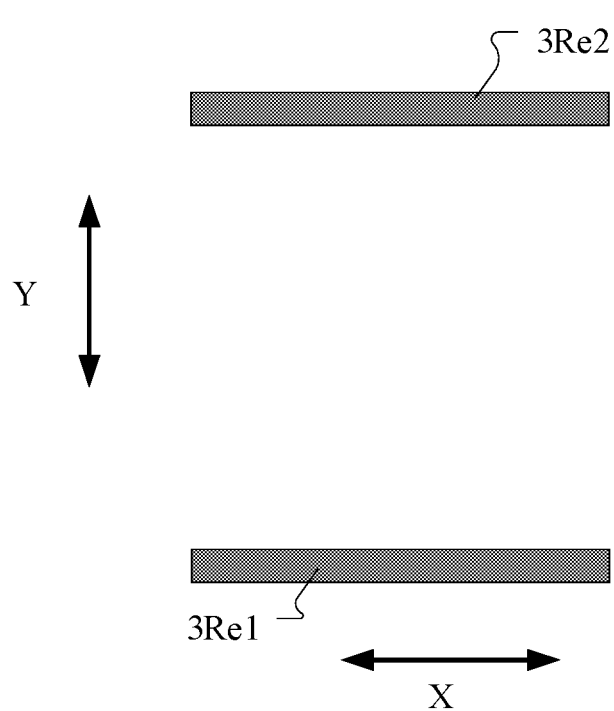
FIG. 12 is a structural layout of a third conductive layer in FIG. 7.
Figure 13:
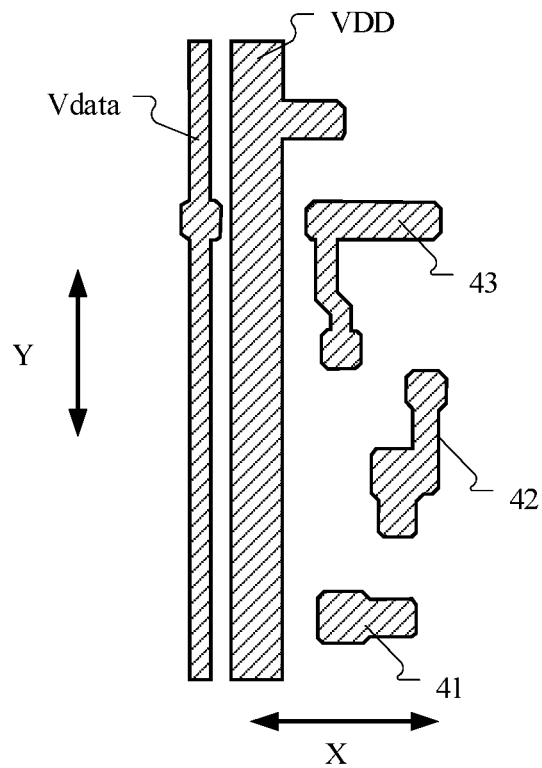
FIG. 13 is a structural layout of a fourth conductive layer in FIG. 7.
Figure 14:
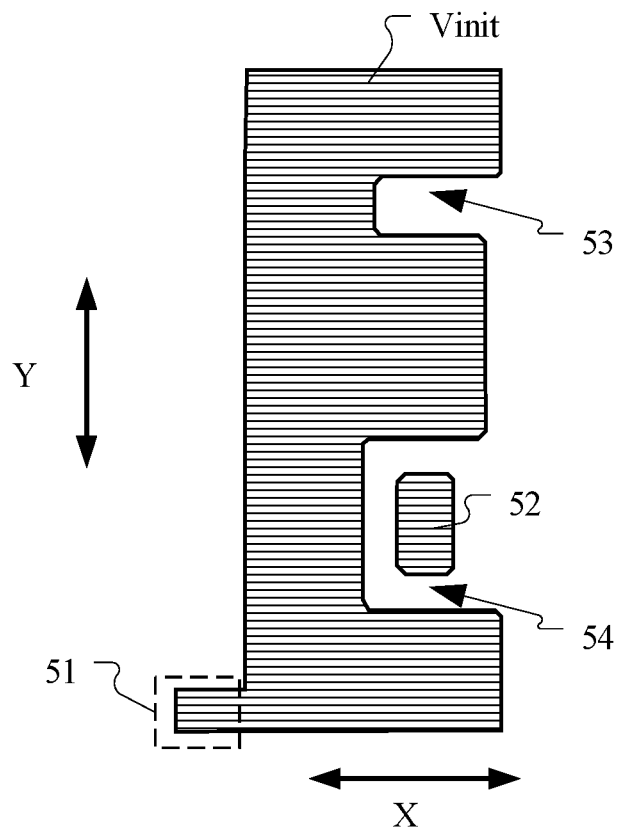
FIG. 14 is a structural layout of a fifth conductive layer in FIG. 7.
Figure 15:
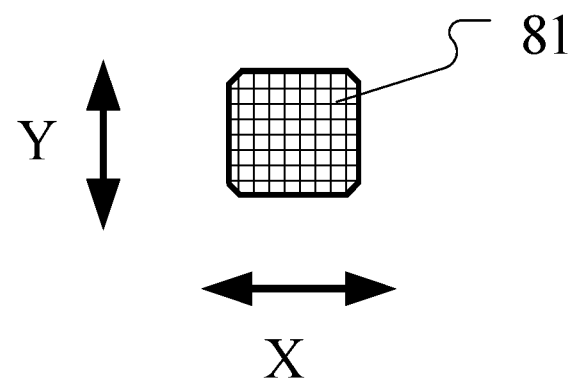
FIG. 15 is a structural layout of an anode layer in FIG. 7.
Figure 18:
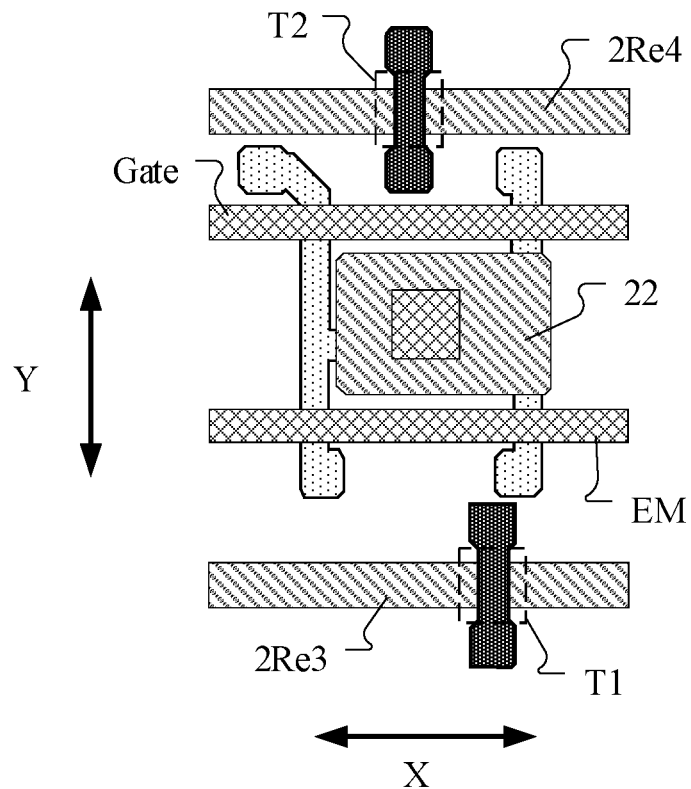
FIG. 18 is a structural layout of a first active layer, a first conductive layer, a second conductive layer and a second active layer in FIG. 7.
Figure 19:
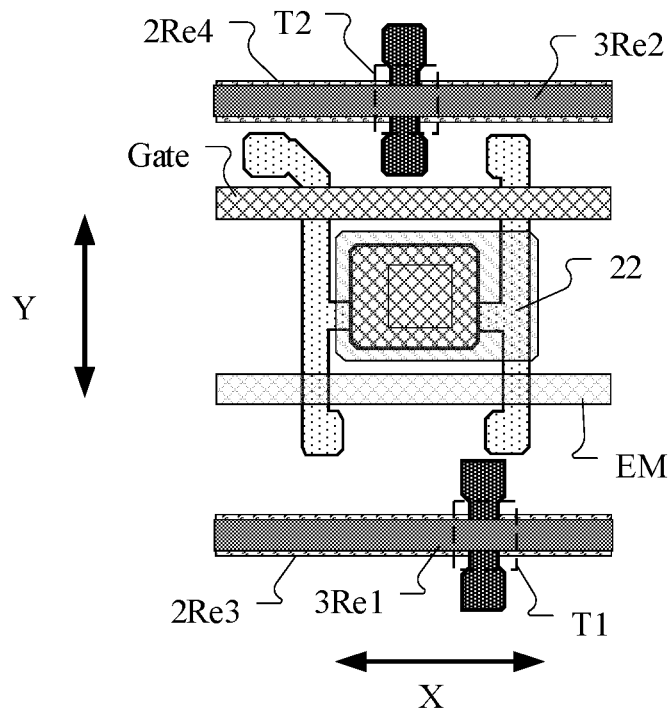
FIG. 19 is a structural layout of a first active layer, a first conductive layer, a second conductive layer, a second active layer and a third conductive layer in FIG. 7.
Figure 20:
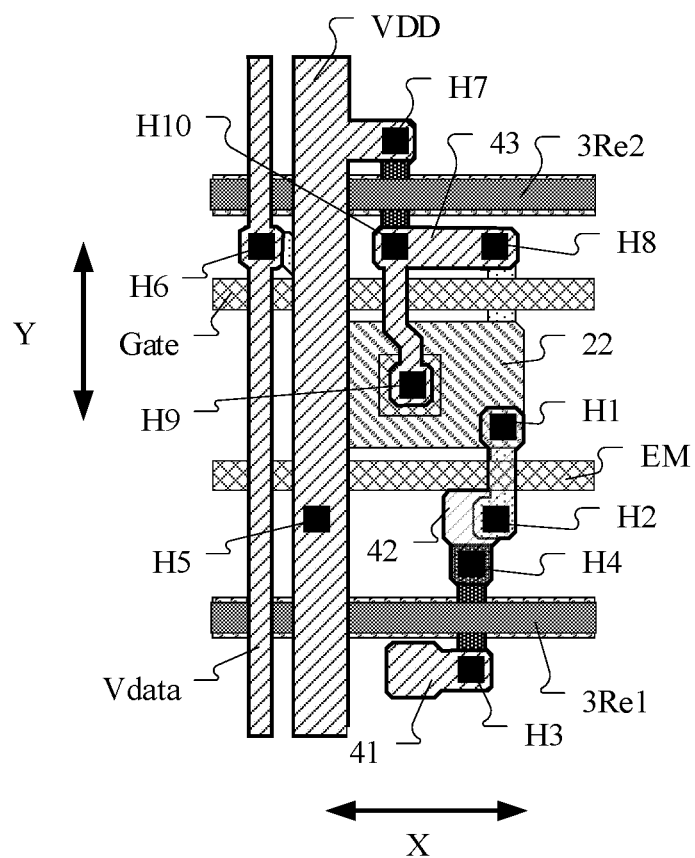
FIG. 20 is a structural layout of a first active layer, a first conductive layer, a second conductive layer, a second active layer, a third conductive layer and a fourth conductive layer in FIG. 7.
Figure 21:
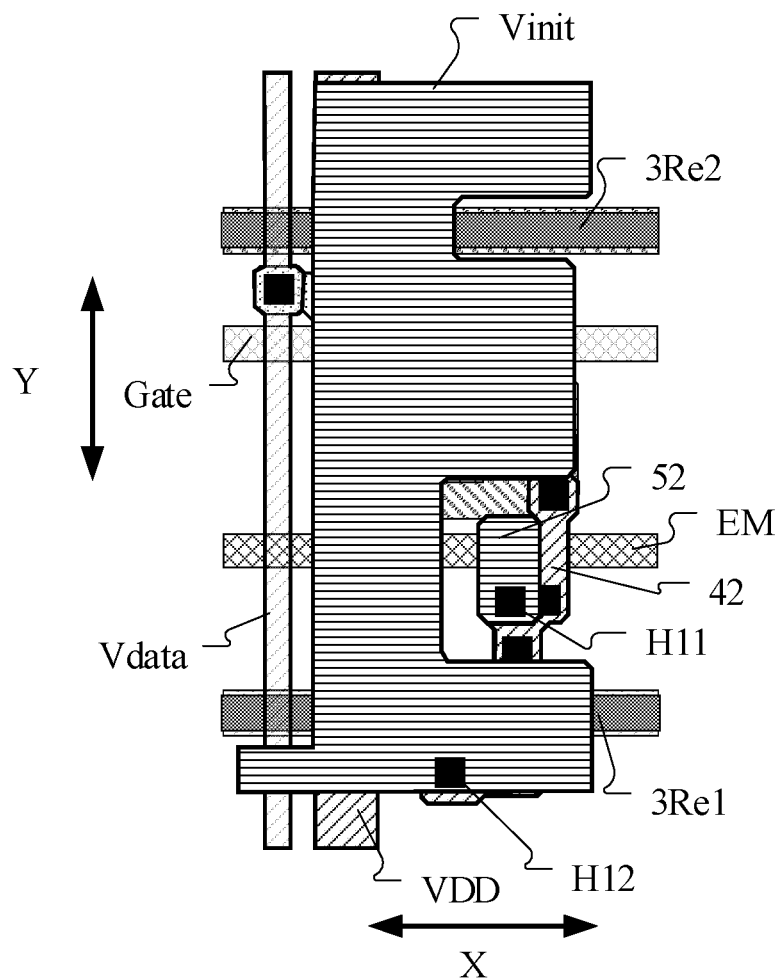
FIG. 21 is a structural layout of a first active layer, a first conductive layer, a second conductive layer, a second active layer, a third conductive layer, a fourth conductive layer and a fifth conductive layer in FIG. 7.

The embodiments of the present disclosure further provide a display panel, and the display panel may include the pixel driving circuit shown in FIG. 4. The display panel may further include a base substrate, a first active layer, a first conductive layer, a second conductive layer, a second active layer, a third conductive layer, a fourth conductive layer, a fifth conductive layer and an anode layer that are stacked in sequence, and an insulating layer may be disposed between the above-mentioned adjacent layers. As shown in FIGS. 7-21, FIG. 7 is a structural layout of an embodiment of a display panel of the present disclosure, FIG. 8 is a structural layout of a first active layer in FIG. 7, FIG. 9 is a structural layout of a first conductive layer in FIG. 7, FIG. 10 is a structural layout of a second conductive layer in FIG. 7, FIG. 11 is a structural layout of a second active layer in FIG. 7, FIG. 12 is a structural layout of a third conductive layer in FIG. 7, FIG. 13 is a structural layout of a fourth conductive layer in FIG. 7, FIG. 14 is a structural layout of a fifth conductive layer in FIG. 7, FIG. 15 is a structural layout of an anode layer in FIG. 7, FIG. 16 is a structural layout of a first active layer and a first conductive layer in FIG. 7, FIG. 17 is a structural layout of a first active layer, a first conductive layer and a second conductive layer in FIG. 7, FIG. 18 is a structural layout of a first active layer, a first conductive layer, a second conductive layer and a second active layer in FIG. 7, FIG. 19 is a structural layout of a first active layer, a first conductive layer, a second conductive layer, a second active layer and a third conductive layer in FIG. 7, FIG. 20 is a structural layout of a first active layer, a first conductive layer, a second conductive layer, a second active layer, a third conductive layer and a fourth conductive layer in FIG. 7, and FIG. 21 is a structural layout of a first active layer, a first conductive layer, a second conductive layer, a second active layer, a third conductive layer, a fourth conductive layer and a fifth conductive layer in FIG. 7.

Figure 7:
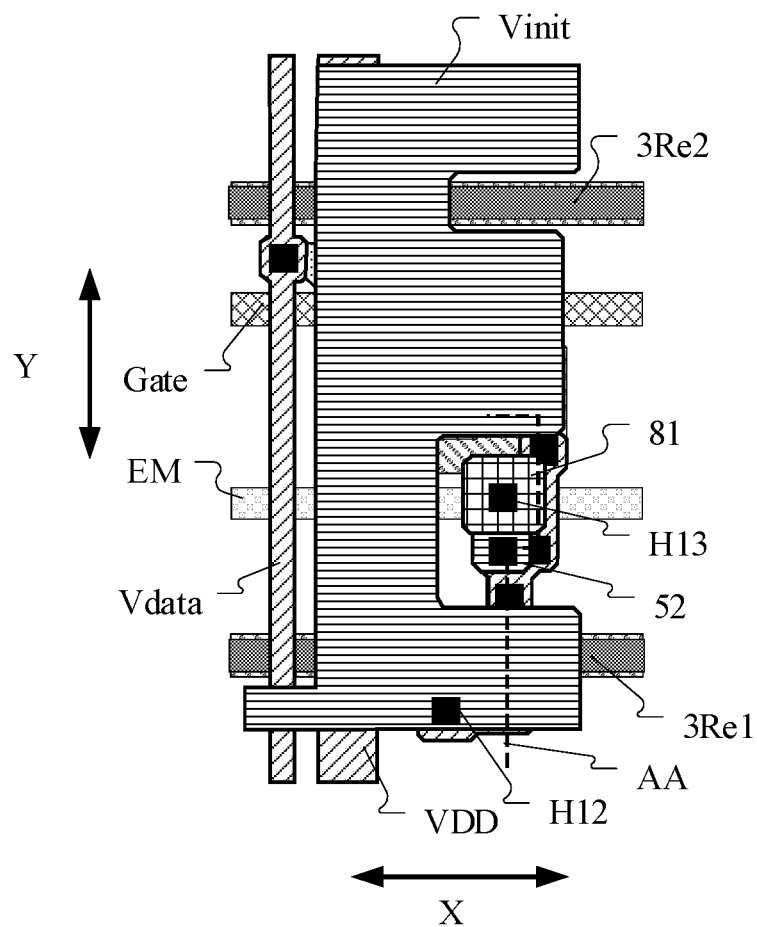
FIG. 7 is a structural layout of an embodiment of a display panel of the present disclosure.
Figure 8:
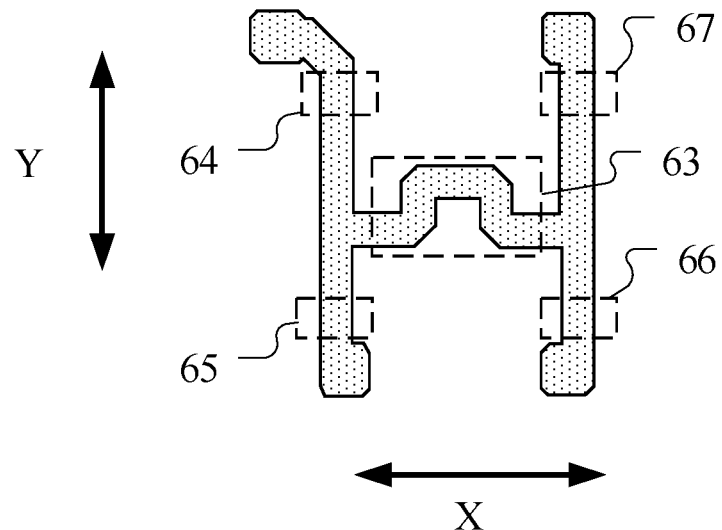
FIG. 8 is a structural layout of a first active layer in FIG. 7.
Figure 16:
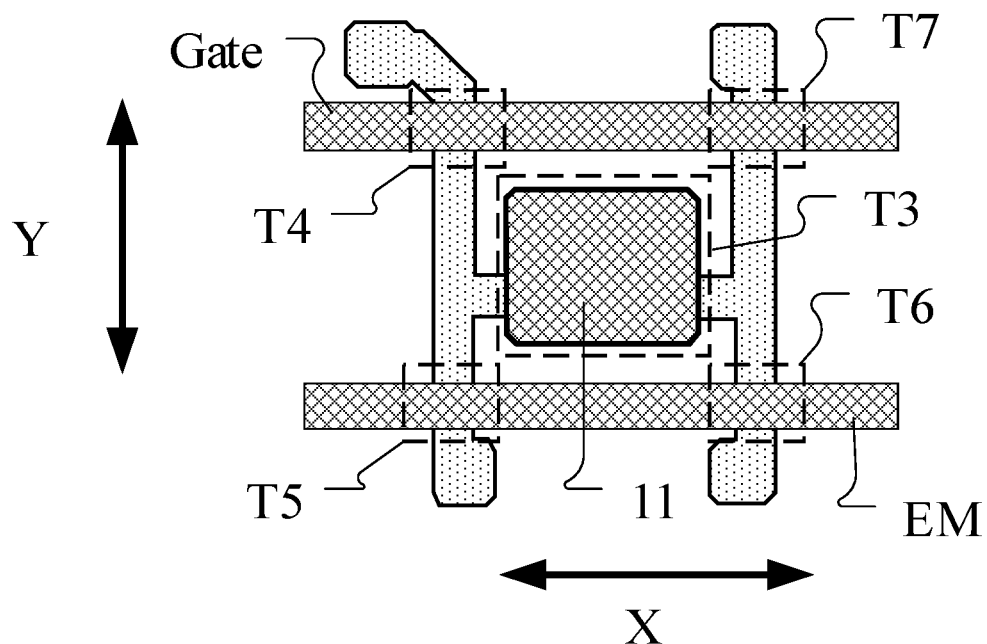
FIG. 16 is a structural layout of a first active layer and a first conductive layer in FIG. 7.

As shown in FIGS. 7, 8 and 16, the first active layer may include a third active portion 63, a fourth active portion 64, a fifth active portion 65, a sixth active portion 66 and a seventh active portion 67. The third active portion 63 is configured to form a channel area of the driving transistor T3, the fourth active portion 64 is configured to form a channel area of the fourth transistor T4, the fifth active portion 65 is configured to form a channel area of the fifth transistor T5, the sixth active portion 66 is configured to form a channel area of the sixth transistor T6, and the seventh active portion 67 is configured to form a channel area of the seventh transistor T7. The first active layer may be formed of polycrystalline silicon, and correspondingly, the driving transistor, the fourth transistor, the fifth transistor, the sixth transistor and the seventh transistor may be the N-type low-temperature polycrystalline silicon transistors.

Figure 9:
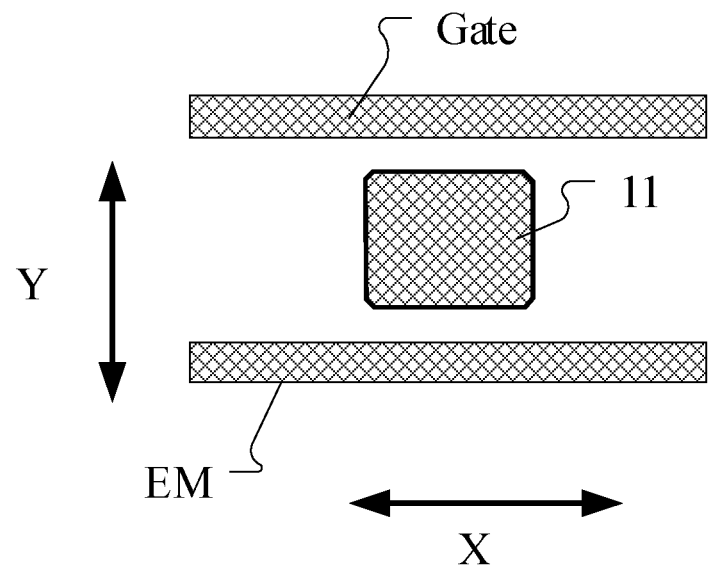
FIG. 9 is a structural layout of a first conductive layer in FIG. 7.

As shown in FIGS. 7, 9 and 16, the first conductive layer may include: a first conductive portion 11, a gate driving signal line Gate and an enable signal line EM. An orthographic projection of the first conductive portion 11 on the base substrate covers an orthographic projection of the third active portion 63 on the base substrate, and the first conductive portion 11 can be configured to form the gate of the driving transistor T3 and the first electrode of the capacitor C. An orthographic projection of the gate driving signal line Gate on the base substrate and an orthographic projection of the enable signal line EM on the base substrate can both extend along a first direction X. The orthographic projection of the gate driving signal line Gate on the base substrate covers an orthographic projection of the fourth active portion 64 on the base substrate and an orthographic projection of the seventh active portion 67 on the base substrate. A partial structure of the gate driving signal line Gate may be configured to form the gate of the fourth transistor, and another partial structure of the gate driving signal line Gate may be configured to form the gate of the seventh transistor. The orthographic projection of the enable signal line EM on the base substrate can cover an orthographic projection of the fifth active portion 65 on the base substrate and an orthographic projection of the sixth active portion 66 on the base substrate. A partial structure of the enable signal line EM can be configured to form the gate of the fifth transistor T5, and another partial structure of the enable signal line EM can be configured to form the gate of the sixth transistor T6. The orthographic projection of the first conductive portion 11 on the base substrate may be located between the orthographic projection of the gate driving signal line Gate on the base substrate and the orthographic projection of the enable signal line EM on the base substrate. In addition, in the display panel, the first active layer is subject to a conductivization treatment by using the first conductive layer as a mask, that is, an area of the first active layer covered by the first conductive layer forms the channel area of the transistor, and an area of the first active layer not covered by the first conductive layer forms a conductor structure.

Figure 10:
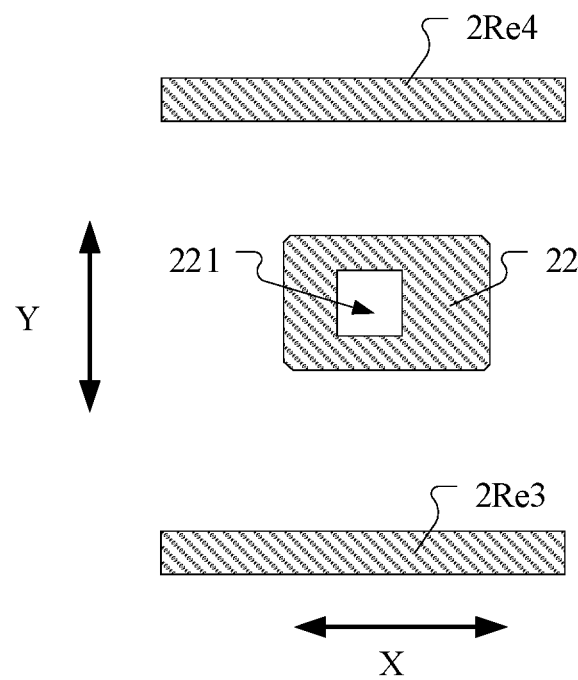
FIG. 10 is a structural layout of a second conductive layer in FIG. 7.
Figure 17:
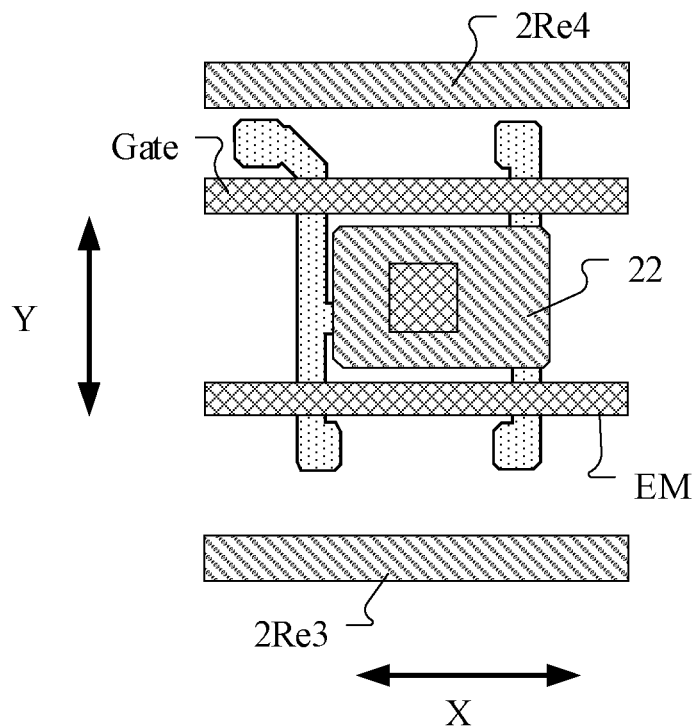
FIG. 17 is a structural layout of a first active layer, a first conductive layer and a second conductive layer in FIG. 7.

As shown in FIGS. 7, 10 and 17, the second conductive layer may include a third reset signal line 2Re3, a fourth reset signal line 2Re4 and a second conductive portion 22. An orthographic projection of the second conductive portion 22 on the base substrate may at least partially overlap with the orthographic projection of the first conductive portion 11 on the base substrate, and the second conductive portion 22 may form the second electrode of the capacitor C. The second conductive portion 22 may also be provided with an opening 221. The third reset signal line 2Re3 may be coupled to the gate of the first transistor T1, and the fourth reset signal line 2Re4 may be coupled to the gate of the second transistor T2. An orthographic projection of the third reset signal line 2Re3 on the base substrate and an orthographic projection of the fourth reset signal line 2Re4 on the base substrate can both extend along the first direction X.

As shown in FIGS. 7, 11 and 18, the second active layer may include a first active portion 71 and a second active portion 72, the first active portion 71 may be configured to form a channel area of the first transistor T1, and the second active portion 72 may be configured to form a channel area of the second transistor. An orthographic projection of the first active portion 71 on the base substrate may be located on a side of the orthographic projection of the enable signal line EM on the base substrate away from the orthographic projection of the first conductive portion 11 on the base substrate, and an orthographic projection of the second active portion 72 on the base substrate may be located on a side of the orthographic projection of the gate driving signal line Gate on the base substrate away from the orthographic projection of the first conductive portion 11 on the base substrate. As shown in FIG. 18, the orthographic projection of the third reset signal line 2Re3 on the base substrate covers the orthographic projection of the first active portion 71 on the base substrate, and a partial structure of the third reset signal line 2Re3 can be configured to form a bottom gate (a second gate) of the first transistor T1. The orthographic projection of the fourth reset signal line 2Re4 on the base substrate covers the orthographic projection of the second active portion 72 on the base substrate, and a partial structure of the fourth reset signal line 2Re4 may be configured to form a bottom gate (a second gate) of the second transistor. The second active layer may be formed of indium gallium zinc oxide, and correspondingly, the first transistor and the second transistor may be the N-type metal oxide transistors.

As shown in FIGS. 7, 12 and 19, the third conductive layer may include a first reset signal line 3Re1 and a second reset signal line 3Re2. An orthographic projection of the first reset signal line 3Re1 on the base substrate may extend along the first direction X, and the orthographic projection of the first reset signal line 3Re1 on the base substrate may cover the orthographic projection of the first active portion 71 on the base substrate. A partial structure of the first reset signal line 3Re1 is configured to form a top gate (a first gate) of the first transistor T1. An orthographic projection of the second reset signal line 3Re2 on the base substrate may extend along the first direction X, and the orthographic projection of the second reset signal line 3Re2 on the base substrate may cover the orthographic projection of the second active portion 72 on the base substrate. A partial structure of the second reset signal line 3Re2 can be configured to form a top gate (a first gate) of the second transistor T2. The first reset signal line 3Re1 can be coupled with the third reset signal line 2Re3 through a via hole, and the via hole can be located in a frame area of the display panel. The second reset signal line 3Re2 can be coupled with the fourth reset signal line 2Re4 through the via hole, and the via hole may be located in the frame area of the display panel. In the display panel, the second active layer is subject to the conductivization treatment by using the third conductive layer as the mask, that is, an area of the second active layer covered by the third conductive layer forms the channel area of the transistor, and an area of the second active layer not covered by the third conductive layer forms the conductor structure.

As shown in FIGS. 7, 13 and 20, the fourth conductive layer may include a data line Vdata, a power line VDD, a bridge portion 41, a bridge portion 42 and a bridge portion 43. The data line Vdata is configured to provide the data signal to the data signal terminal in FIG. 4, and the power line VDD is configured to provide the voltage signal to the first power terminal in FIG. 4. An orthographic projection of the data line Vdata on the base substrate and an orthographic projection of the power line VDD on the base substrate may extend along a second direction Y, and the second direction Y may intersect the first direction X. For example, the second direction Y may be perpendicular to the first direction X. As shown in FIG. 20, the orthographic projection of the power line VDD on the base substrate may be located between the orthographic projection of the data line Vdata on the base substrate and the orthographic projection of the first conductive portion 11 on the base substrate, so that the power line VDD can shield a noise influence of the data line Vdata on the first conductive portion 11, thereby improving voltage stability of the gate of the driving transistor in the light-emitting stage. The bridge portion 41 can be coupled to the second active layer on a side of the first active portion 71 through a via hole H3 to be coupled to the first electrode of the first transistor T1. The bridge portion 42 can be coupled to the second conductive portion 22 through a via hole H1, can be coupled to the first active layer on a side of the sixth active portion 66 away from the third active portion 63 through a via hole H2, and can be coupled to the second active layer on the other side of the first active portion 71 through a via hole H4, so as to be coupled to the second electrode of the capacitor C, the second electrode of the sixth transistor and the second electrode of the first transistor. The bridge portion 43 can be coupled to the first active layer on a side of the seventh active portion 67 away from the third active portion 63 through a via hole H8, can be coupled to the second active layer on a side of the second active portion 72 through a via hole H10, and can be coupled to the first conductive portion 11 through a via hole H9, so as to be coupled to the first electrode of the seventh transistor, the gate of the driving transistor and the second electrode of the second transistor. An orthographic projection of the via hole H9 on the base substrate is located within an orthographic projection of the opening 221 on the base substrate, so that a conductive structure in the via hole H9 is insulated from the second conductive portion 22. The power line VDD can be coupled to the second active layer on the other side of the second active portion 72 through a via hole H7 to be coupled to the first power terminal and the first electrode of the second transistor, and the power line VDD can be coupled to the first active layer on a side of the fifth active portion away from the third active portion through a via hole H5 to be coupled to the first power terminal and the first electrode of the fifth transistor. The data line Vdata can be coupled to the first active layer on a side of the fourth active portion 64 away from the third active portion 63 through a via hole H6 to be coupled to the first electrode of the fourth transistor and the data signal terminal.

As shown in FIGS. 7, 14 and 21, the fifth conductive layer may include an initial signal line Vinit, a conductive portion 52 and a connection portion 51. An orthographic projection of the initial signal line Vinit on the base substrate may extend along the second direction Y, and the initial signal line Vinit can be configured to provide the initial signal terminal in FIG. 4. The initial signal line Vinit may be coupled to the bridge portion 41 through a via hole H12 to be coupled to the first electrode of the first transistor T1 and the initial signal terminal. The conductive portion 52 may be coupled to the bridge portion 42 through a via hole H11 to be coupled to the second electrode of the sixth transistor. An orthographic projection of the connection portion 51 on the base substrate may extend along the first direction X, and the connection portion 51 may be coupled between two adjacent initial signal lines Vinit, so that the initial signal lines form a grid structure, and the initial signal lines with the grid structure may have relatively small resistances, so that the initial signal lines at different positions on the display panel have relatively small voltage differences. In addition, a sheet resistance of the fifth conductive layer may be smaller than a sheet resistance of any one of the first conductive layer, the second conductive layer and the third conductive layer. In the embodiments of the present disclosure, arranging the initial signal line on the fifth conductive layer can further reduce the resistance of the initial signal line. The orthographic projection of the initial signal line Vinit on the base substrate may cover the orthographic projection of the first active portion 71 on the base substrate and the orthographic projection of the second active portion 72 on the base substrate. The initial signal line Vinit can play a role of blocking the light for the channel area of the first transistor T1 and the channel area of the second transistor T2, thereby preventing the occurrence of property changes in the first transistor and the second transistor due to exposure to light. In the embodiments of the present disclosure, the orthographic projection of the initial signal line Vinit on the base substrate may cover the orthographic projection of the first conductive portion 11 on the base substrate. The initial signal line Vinit can form a parallel-plate capacitor structure with the first conductive portion 11, the voltage on the initial signal line Vinit can be a stable voltage, and the initial signal line Vinit can play a role of stabilizing the voltage of the first conductive portion 11, thereby reducing the voltage fluctuation of the gate of the driving transistor during the light-emitting stage. The initial signal line Vinit may be provided with an opening 53, an orthographic projection of the opening 53 on the base substrate may at least partially overlap with the orthographic projection of the second reset signal line 3Re2 on the base substrate, and the orthographic projection of the opening 53 on the base substrate may also at least partially overlap with the orthographic projection of the fourth reset signal line 2Re4 on the base substrate. This arrangement can reduce an overlapping area of the initial signal line Vinit and the second reset signal line 3Re2, and can reduce an overlapping area of the initial signal line Vinit and the fourth reset signal line 2Re4, so that parasitic capacitances on the second reset signal line 3Re2 and the fourth reset signal line 2Re4 are reduced, thereby increasing a charging speed of the second reset signal line 3Re2 and the fourth reset signal line 2Re4. The initial signal line Vinit may also be provided with an opening 54, the conductive portion 52 may be located in the opening 54, and an orthographic projection of the opening 54 on the base substrate may at least partially overlap with the orthographic projection of the enable signal line EM on the base substrate. This arrangement can also reduce the parasitic capacitance of the enable signal line EM, thereby increasing a charging speed of the enable signal line. As shown in FIG. 14, the openings 53 and 54 may be notches located at edges of the initial signal line Vinit, that is, the openings 53 and 54 are non-closed patterns. It should be understood that in other embodiments, the openings 53 and 54 may also be located within the initial signal line Vinit, that is, the opening 53 and the opening 54 may be closed patterns.

As shown in FIGS. 7 and 15, the anode layer may include an anode portion 81, and the anode portion 81 may be coupled to the conductive portion 52 through a via hole H13. The anode portion 81 may be configured to form an anode of the light-emitting unit OLED.

Figure 22:
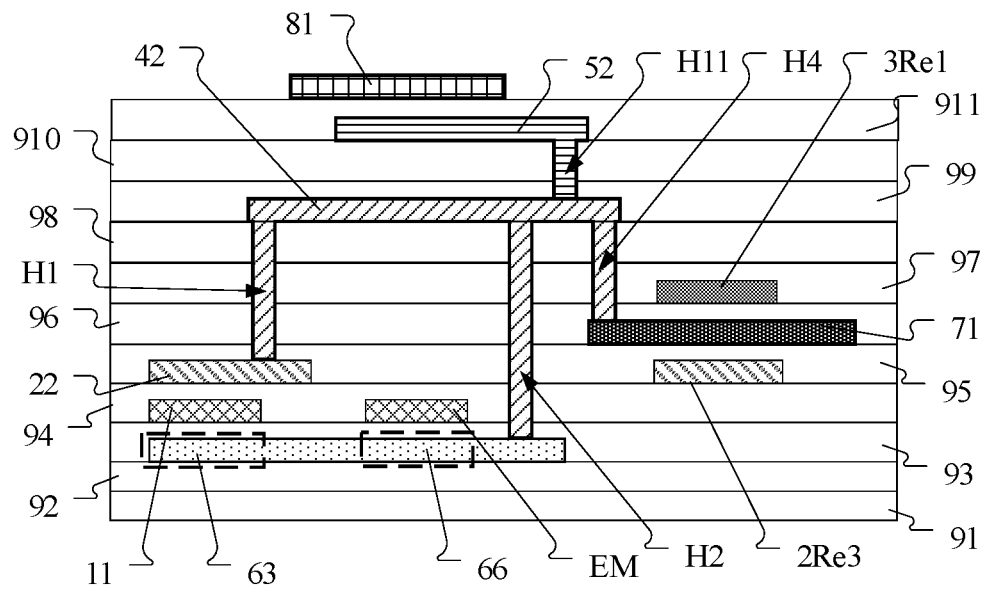
FIG. 22 is a partial cross-sectional view taken along a dotted line AA in FIG. 7.

FIG. 22 is a partial cross-sectional view taken along a dotted line AA in FIG. 7, and as shown in FIG. 22, the pixel driving circuit may further include a buffer layer 92, a first insulating layer 93, a second insulating layer 94, a third insulating layer 95, a fourth insulating layer 96, a first dielectric layer 97, a second dielectric layer 98, a passivation layer 99, a first flat layer 910 and a second flat layer 911. The base substrate 91, the buffer layer 92, the first active layer, the first insulating layer 93, the first conductive layer, the second insulating layer 94, the second conductive layer, the third insulating layer 95, the second active layer, the fourth insulating layer 96, the third conductive layer, the first dielectric layer 97, the second dielectric layer 98, the fourth conductive layer, the passivation layer 99, the first flat layer 910, the fifth conductive layer, the second flat layer 911 and the anode layer are stacked in sequence. The buffer layer 92 may include at least one of a silicon oxide layer and a silicon nitride layer. The first insulating layer 93, the second insulating layer 94, the third insulating layer 95 and the fourth insulating layer 96 may include silicon oxide layers. The first dielectric layer 97 and the second dielectric layer 98 may include silicon nitride layers. Materials of the first flat layer 910 and the second flat layer 911 may include organic materials such as organic resins, such as polyimide (PI), polyethylene terephthalate (PET), polyethylene naphthalate (PEN), silicon-glass bonding structure (or silicon-on-glass) (SOG) and other materials. A material of the passivation layer 99 may include an organic insulating material or an inorganic insulating material. The anode layer may be formed of an indium tin oxide (ITO) material. Materials of the fourth conductive layer and the fifth conductive layer may include metal materials, such as an alloy or one of molybdenum, aluminum, copper, titanium, and niobium, or a molybdenum/titanium alloy or stacked layer, or a titanium/aluminum/titanium stacked layer. Materials of the first conductive layer, the second conductive layer and the third conductive layer can be an alloy or one of molybdenum, aluminum, copper, titanium and niobium, or a molybdenum/titanium alloy or stacked layer.

Figure 27:
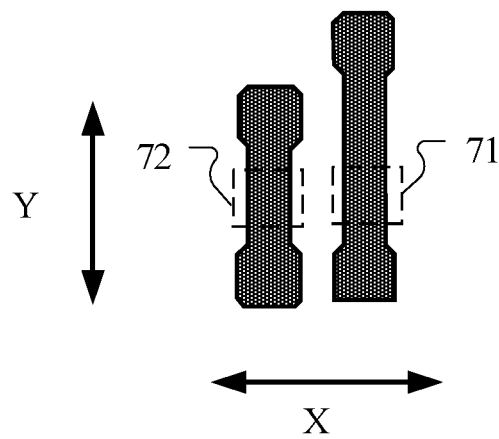
FIG. 27 is a structural layout of a second active layer in FIG. 23.
Figure 28:
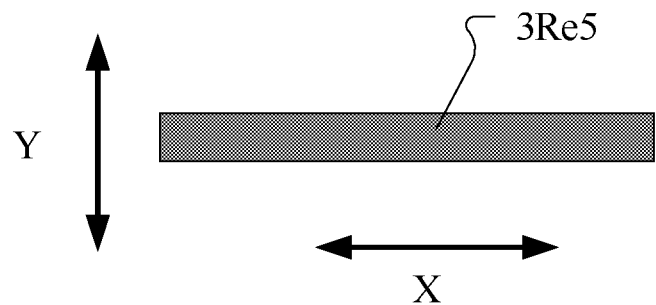
FIG. 28 is a structural layout of a third conductive layer in FIG. 23.
Figure 29:
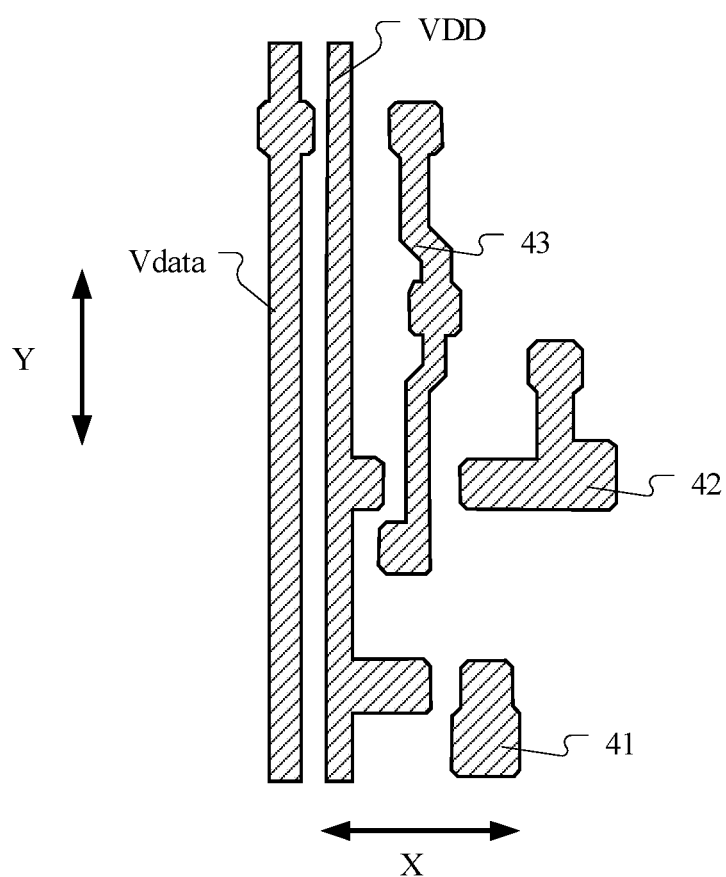
FIG. 29 is a structural layout of a fourth conductive layer in FIG. 23.
Figure 30:
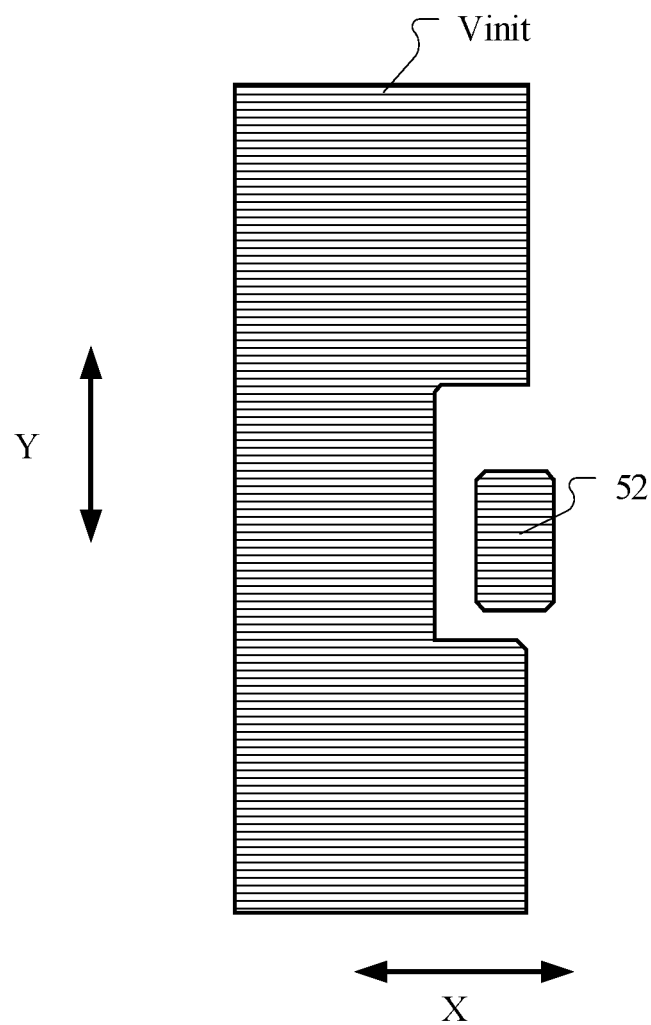
FIG. 30 is a structural layout of a fifth conductive layer in FIG. 23.
Figure 31:
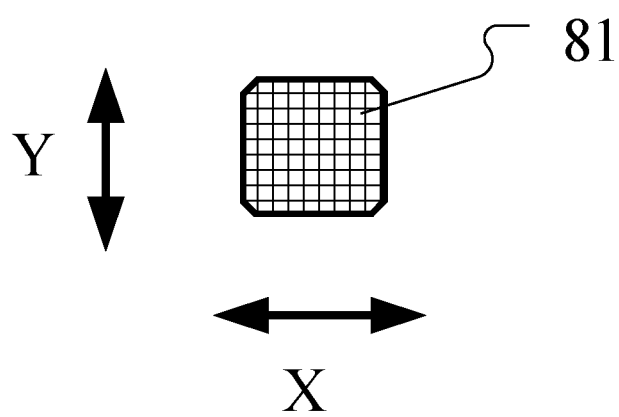
FIG. 31 is a structural layout of an anode layer in FIG. 23.
Figure 34:
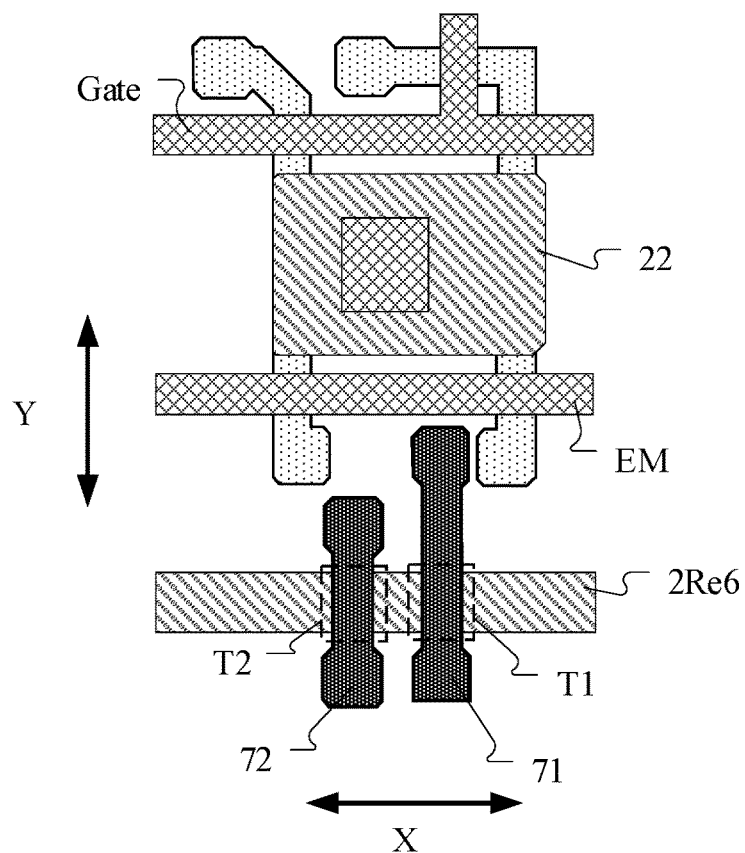
FIG. 34 is a structural layout of a first active layer, a first conductive layer, a second conductive layer and a second active layer in FIG. 23.
Figure 35:
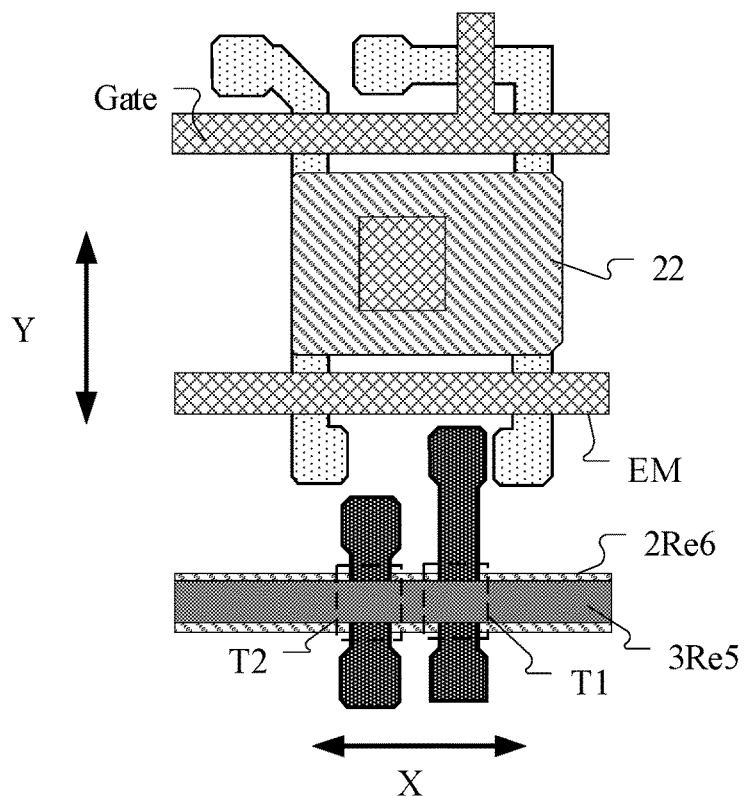
FIG. 35 is a structural layout of a first active layer, a first conductive layer, a second conductive layer, a second active layer and a third conductive layer in FIG. 23.
Figure 36:
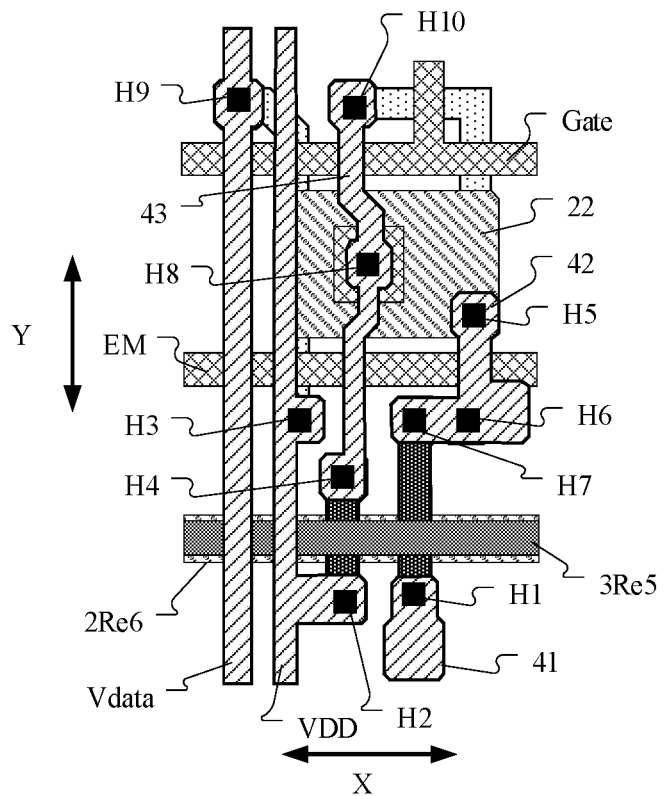
FIG. 36 is a structural layout of a first active layer, a first conductive layer, a second conductive layer, a second active layer, a third conductive layer and a fourth conductive layer in FIG. 23.
Figure 37:
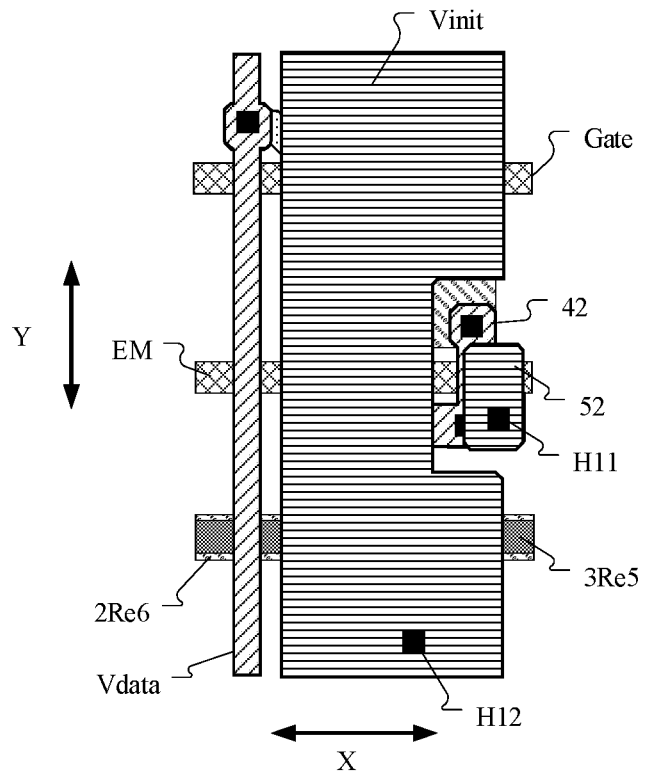
FIG. 37 is a structural layout of a first active layer, a first conductive layer, a second conductive layer, a second active layer, a third conductive layer, a fourth conductive layer and a fifth conductive layer in FIG. 23.

The embodiments of the present disclosure further provide another display panel, the display panel may include the pixel driving circuit shown in FIG. 4, and the display panel may further include a base substrate, a first active layer, a first conductive layer, a second conductive layer, a second active layer, a third conductive layer, a fourth conductive layer, a fifth conductive layer and an anode layer that are stacked in sequence, and an insulating layer may be disposed between the above-mentioned adjacent layers. As shown in FIGS. 23-37, FIG. 23 is a structural layout of an embodiment of a display panel of the present disclosure, FIG. 24 is a structural layout of a first active layer in FIG. 23, FIG. 25 is a structural layout of a first conductive layer in FIG. 23, FIG. 26 is a structural layout of a second conductive layer in FIG. 23, FIG. 27 is a structural layout of a second active layer in FIG. 23, FIG. 28 is a structural layout of a third conductive layer in FIG. 23, FIG. 29 is a structural layout of a fourth conductive layer in FIG. 23, FIG. 30 is a structural layout of a fifth conductive layer in FIG. 23, FIG. 31 is a structural layout of an anode layer in FIG. 23, FIG. 32 is a structural layout of a first active layer and a first conductive layer in FIG. 23, FIG. 33 is a structural layout of a first active layer, a first conductive layer and a second conductive layer in FIG. 23, FIG. 34 is a structural layout of a first active layer, a first conductive layer, a second conductive layer and a second active layer in FIG. 23, FIG. 35 is a structural layout of a first active layer, a first conductive layer, a second conductive layer, a second active layer and a third conductive layer in FIG. 23, FIG. 36 is a structural layout of a first active layer, a first conductive layer, a second conductive layer, a second active layer, a third conductive layer and a fourth conductive layer in FIG. 23, and FIG. 37 is a structural layout of a first active layer, a first conductive layer, a second conductive layer, a second active layer, a third conductive layer, a fourth conductive layer and a fifth conductive layer in FIG. 23.

Figure 23:
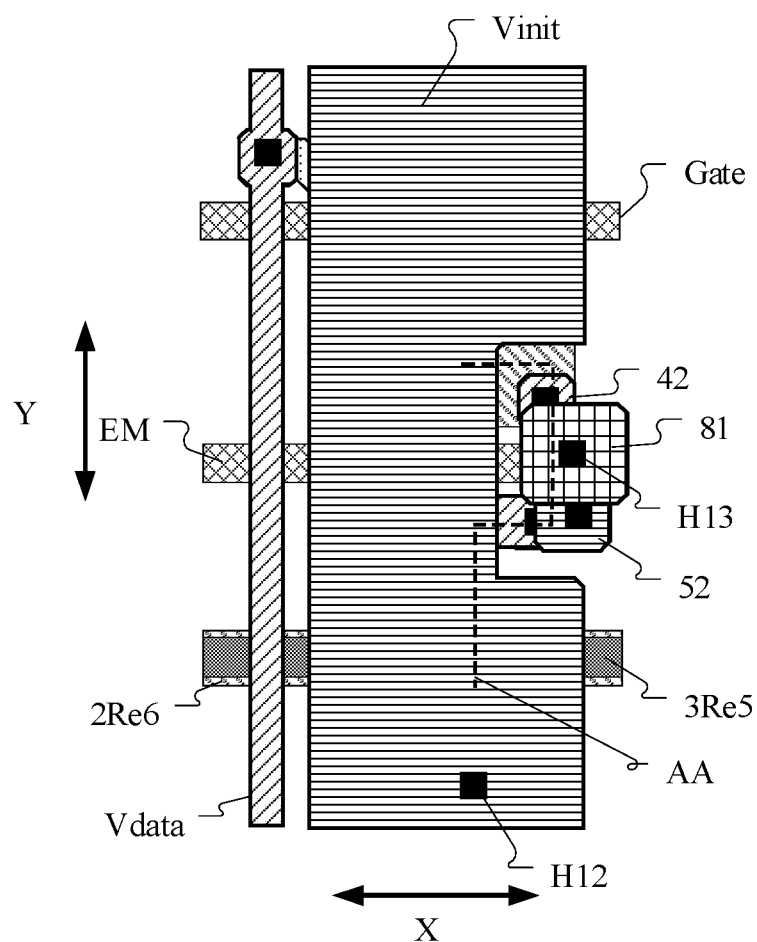
FIG. 23 is a structural layout of an embodiment of a display panel of the present disclosure.
Figure 24:
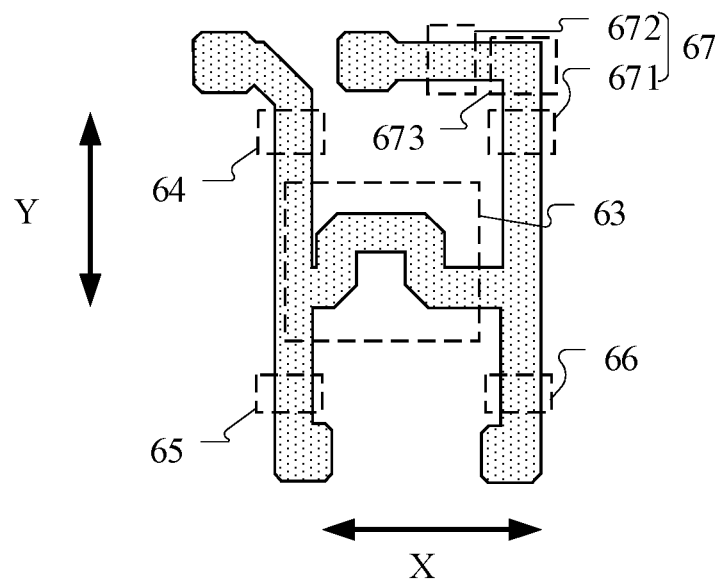
FIG. 24 is a structural layout of a first active layer in FIG. 23.
Figure 32:
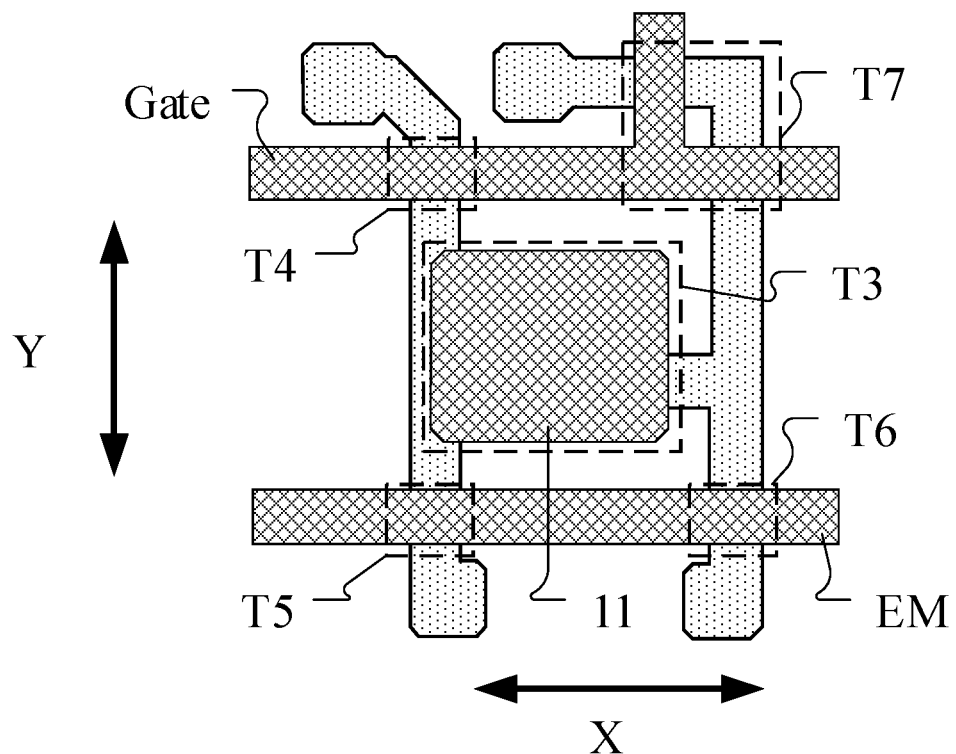
FIG. 32 is a structural layout of a first active layer and a first conductive layer in FIG. 23.

As shown in FIGS. 23, 24 and 32, the first active layer may include a third active portion 63, a fourth active portion 64, a fifth active portion 65, a sixth active portion 66 and a seventh active portion 67. The third active portion 63 is configured to form the channel area of the driving transistor T3, the fourth active portion 64 is configured to form the channel area of the fourth transistor T4, the fifth active portion 65 is configured to form the channel area of the fifth transistor T5, and the sixth active portion 66 is configured to form the channel area of the sixth transistor T6. The seventh active portion 67 may include a first sub-active portion 671 and a second sub-active portion 672, the first sub-active portion 671 may be configured to form a first channel area of the seventh transistor, and the second sub-active portion 672 may be configured to form a second channel area of the seventh transistor. The first active layer may further include a third sub-active portion 673 coupled between the first sub-active portion 671 and the second sub-active portion 672. The first active layer may be formed of polycrystalline silicon, and correspondingly, the driving transistor, the fourth transistor, the fifth transistor, the sixth transistor and the seventh transistor may be the N-type low-temperature polycrystalline silicon transistors.

Figure 25:
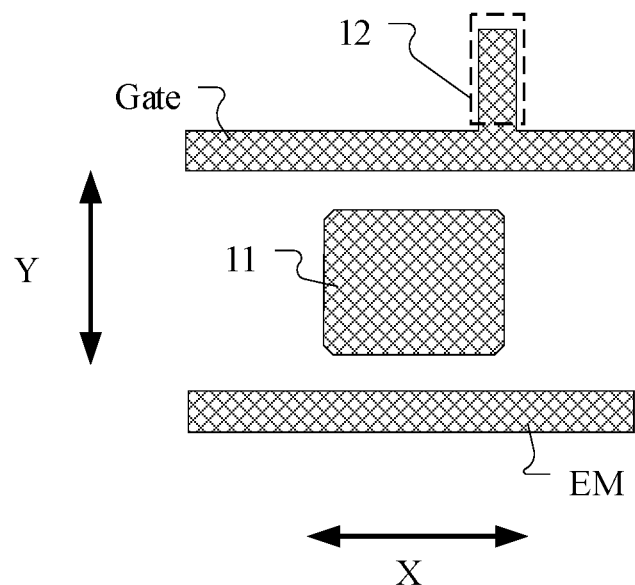
FIG. 25 is a structural layout of a first conductive layer in FIG. 23.

As shown in FIGS. 23, 25 and 32, the first conductive layer may include a first conductive portion 11, a gate driving signal line Gate, an enable signal line EM, and a protrusion portion 12. An orthographic projection of the first conductive portion 11 on the base substrate covers the third active portion 63, and the first conductive portion 11 can be configured to form the gate of the driving transistor T3 and the first electrode of the capacitor C. An orthographic projection of the gate driving signal line Gate on the base substrate and an orthographic projection of the enable signal line EM on the base substrate can both extend along a first direction X. The orthographic projection of the gate driving signal line Gate on the base substrate covers an orthographic projection of the fourth active portion 64 on the base substrate and an orthographic projection of the first sub-active portion 671 on the base substrate. A partial structure of the gate driving signal line Gate may be configured to form the gate of the fourth transistor, and another partial structure of the gate driving signal line Gate may be configured to form the first gate of the seventh transistor. The orthographic projection of the enable signal line EM on the base substrate can cover an orthographic projection of the fifth active portion 65 on the base substrate and an orthographic projection of the sixth active portion 66 on the base substrate. A partial structure of the enable signal line EM can be configured to form the gate of the fifth transistor T5, and another partial structure of the enable signal line EM can be configured to form the gate of the sixth transistor T6. The orthographic projection of the first conductive portion 11 on the base substrate may be located between the orthographic projection of the gate driving signal line Gate on the base substrate and the orthographic projection of the enable signal line EM on the base substrate. The protrusion portion 12 is coupled to the gate driving signal line Gate, and an orthographic projection of the protrusion portion 12 on the base substrate covers an orthographic projection of the second sub-active portion 672 on the base substrate. A partial structure of the protrusion portion 12 can be configured to form a second gate of the seventh transistor. In addition, in the display panel, the first active layer is subject to the conductivization treatment by using the first conductive layer as the mask, that is, an area of the first active layer covered by the first conductive layer forms the channel area of the transistor, and an area of the first active layer not covered by the first conductive layer forms the conductor structure.

Figure 26:
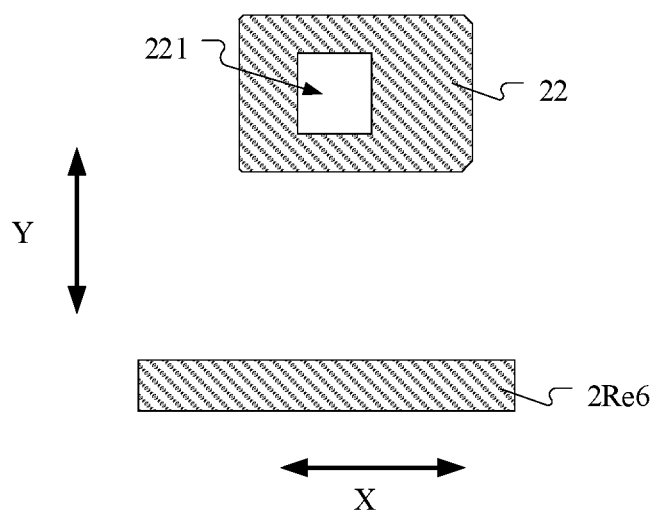
FIG. 26 is a structural layout of a second conductive layer in FIG. 23.
Figure 33:
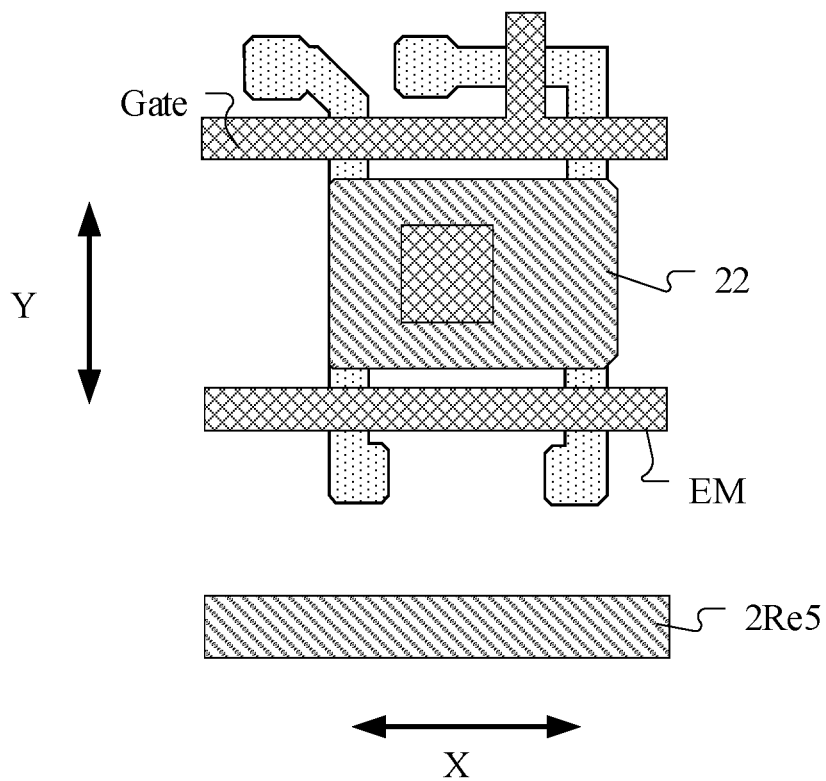
FIG. 33 is a structural layout of a first active layer, a first conductive layer and a second conductive layer in FIG. 23.

As shown in FIGS. 23, 26 and 33, the second conductive layer may include a sixth reset signal line 2Re6 and a second conductive portion 22. An orthographic projection of the second conductive portion 22 on the base substrate may at least partially overlap with the orthographic projection of the first conductive portion 11 on the base substrate, and the second conductive portion 22 may form the second electrode of the capacitor C. The second conductive portion 22 may also be provided with an opening 221. The sixth reset signal line 2Re6 may be coupled to the gate of the first transistor T1 and the gate of the second transistor T2. An orthographic projection of the sixth reset signal line 2Re6 on the base substrate may extend along the first direction X.

As shown in FIGS. 23, 27 and 34, the second active layer may include a first active portion 71 and a second active portion 72, the first active portion 71 may be configured to form the channel area of the first transistor T1, and the second active portion 72 may be configured to form the channel area of the second transistor. An orthographic projection of the first active portion 71 on the base substrate and an orthographic projection of the second active portion 72 on the base substrate may be located on a side of the orthographic projection of the enable signal line EM on the base substrate away from the orthographic projection of the first conductive portion 11 on the base substrate. The orthographic projection of the sixth reset signal line 2Re6 on the base substrate can cover the orthographic projection of the first active portion 71 on the base substrate and the orthographic projection of the second active portion 72 on the base substrate. A partial structure of the sixth reset signal line 2Re6 may be configured to form the bottom gate (the second gate) of the first transistor T1, and another partial structure of the sixth reset signal line 2Re6 may be configured to form the bottom gate (the second gate) of the second transistor T2. The second active layer may be formed of indium gallium zinc oxide, and correspondingly, the first transistor and the second transistor may be the N-type metal oxide transistors.

As shown in FIGS. 23, 28 and 35, the third conductive layer may include a fifth reset signal line 3Re5, an orthographic projection of the fifth reset signal line 3Re5 on the base substrate may extend along the first direction X, and the orthographic projection of the fifth reset signal line 3Re5 on the base substrate may cover the orthographic projection of the first active portion 71 on the base substrate and the orthographic projection of the second active portion 72 on the base substrate. A partial structure of the fifth reset signal line 3Re5 is configured to form the top gate (the first gate) of the first transistor T1, and another partial structure of the fifth reset signal line 3Re5 is configured to form the top gate (the first gate) of the second transistor T2. The fifth reset signal line 3Re5 may be coupled with the sixth reset signal line 2Re6 through the via hole, and the via hole may be located in the frame area of the display panel. In the display panel, the second active layer is subject to the conductivization treatment by using the third conductive layer as the mask, that is, an area of the second active layer covered by the third conductive layer forms the channel area of the transistor, and an area of the second active layer not covered by the third conductive layer forms the conductor structure.

As shown in FIGS. 23, 29 and 36, the fourth conductive layer may include a data line Vdata, a power line VDD, a bridge portion 41, a bridge portion 42 and a bridge portion 43. The data line Vdata is configured to provide the data signal terminal in FIG. 4, and the power line VDD is configured to provide the first power terminal in FIG. 4. An orthographic projection of the data line Vdata on the base substrate and an orthographic projection of the power line VDD on the base substrate may extend along a second direction Y, and the second direction Y may intersect the first direction X. For example, the second direction Y may be perpendicular to the first direction X. As shown in FIG. 36, the orthographic projection of the power line VDD on the base substrate may be located between the orthographic projection of the data line Vdata on the base substrate and the orthographic projection of the first conductive portion 11 on the base substrate, so that the power line VDD can shield the noise influence of the data line Vdata on the first conductive portion 11, thereby improving the voltage stability of the gate of the driving transistor in the light-emitting stage. The bridge portion 41 can be coupled to the second active layer on a side of the first active portion 71 through a via hole H1 to be coupled to the first electrode of the first transistor T1. The bridge portion 42 can be coupled to the second conductive portion 22 through a via hole H5, can be coupled to the first active layer on a side of the sixth active portion 66 away from the third active portion 63 through a via hole H6, and can be coupled to the second active layer on the other side of the first active portion 71 through a via hole H7, so as to be coupled to the second electrode of the capacitor C, the second electrode of the sixth transistor and the second electrode of the first transistor. The bridge portion 43 can be coupled to the first active layer on a side of the seventh active portion 67 away from the third active portion 63 through a via hole H10, can be coupled to the second active layer on a side of the second active portion 72 through a via hole H4, and can be coupled to the first conductive portion 11 through a via hole H8, so as to be coupled to the first electrode of the seventh transistor, the gate of the driving transistor and the second electrode of the second transistor. An orthographic projection of the via hole H8 on the base substrate is located within an orthographic projection of the opening 221 on the base substrate, so that a conductive structure in the via hole H8 is insulated from the second conductive portion 22. The power line VDD can be coupled to the second active layer on the other side of the second active portion 72 through a via hole H2 to be coupled to the first power terminal and the first electrode of the second transistor, and the power line VDD is coupled to the first active layer on a side of the fifth active portion 65 away from the third active portion 63 through a via hole H3 to be coupled to the first electrode of the fifth transistor and the first power terminal. The data line Vdata can be coupled to the first active layer on a side of the fourth active portion 64 away from the third active portion 63 through a via hole H9 to be coupled to the first electrode of the fourth transistor and the data signal terminal. In the first direction X, the orthographic projection of the second active portion 72 on the base substrate may be located between the orthographic projection of the data line Vdata on the base substrate and the orthographic projection of the first active portion 71 on the base substrate, and this arrangement may facilitate the coupling of the first electrode of the second transistor and the gate of the driving transistor.

As shown in FIGS. 23, 30 and 37, the fifth conductive layer may include an initial signal line Vinit and a conductive portion 52. An orthographic projection of the initial signal line Vinit on the base substrate may extend along the second direction Y, and the initial signal line Vinit can be configured to provide the initial signal terminal in FIG. 4. The initial signal line Vinit may be coupled to the bridge portion 41 through a via hole H12 to be coupled to the first electrode of the first transistor T1 and the initial signal terminal. The conductive portion 52 may be coupled to the bridge portion 42 through a via hole H11 to be coupled to the second electrode of the sixth transistor. A sheet resistance of the fifth conductive layer may be smaller than a sheet resistance of any one of the first conductive layer, the second conductive layer and the third conductive layer. In the embodiments of the present disclosure, arranging the initial signal line on the fifth conductive layer can reduce the resistance of the initial signal line. The orthographic projection of the initial signal line Vinit on the base substrate may cover the orthographic projection of the first active portion 71 on the base substrate and the orthographic projection of the second active portion 72 on the base substrate. The initial signal line Vinit can play a role of blocking the light for the channel area of the first transistor T1 and the channel area of the second transistor T2, thereby preventing the occurrence of property changes in the first transistor and the second transistor due to exposure to light. In the embodiments of the present disclosure, the orthographic projection of the initial signal line Vinit on the base substrate may cover the orthographic projection of the first conductive portion 11 on the base substrate. The initial signal line Vinit can form the parallel-plate capacitor structure with the first conductive portion 11, the voltage on the initial signal line Vinit can be the stable voltage, and the initial signal line Vinit can play a role of stabilizing the voltage of the first conductive portion 11, thereby reducing the voltage fluctuation of the gate of the driving transistor in the light-emitting stage. The orthographic projection of the initial signal line Vinit on the base substrate can also cover an orthographic projection of the third sub-active portion 673 on the base substrate, and the initial signal line Vinit can play a role of stabilizing the voltage of the third sub-active portion 673, thereby reducing a leakage current from the third sub-active portion 673 to the source and drain of the seventh transistor caused by the voltage fluctuation of the third sub-active portion 673.

As shown in FIGS. 23 and 31, the anode layer may include an anode portion 81, and the anode portion 81 may be coupled to the conductive portion 52 through a via hole H13. The anode portion 81 may be configured to form the anode of the light-emitting unit OLED.

Figure 38:
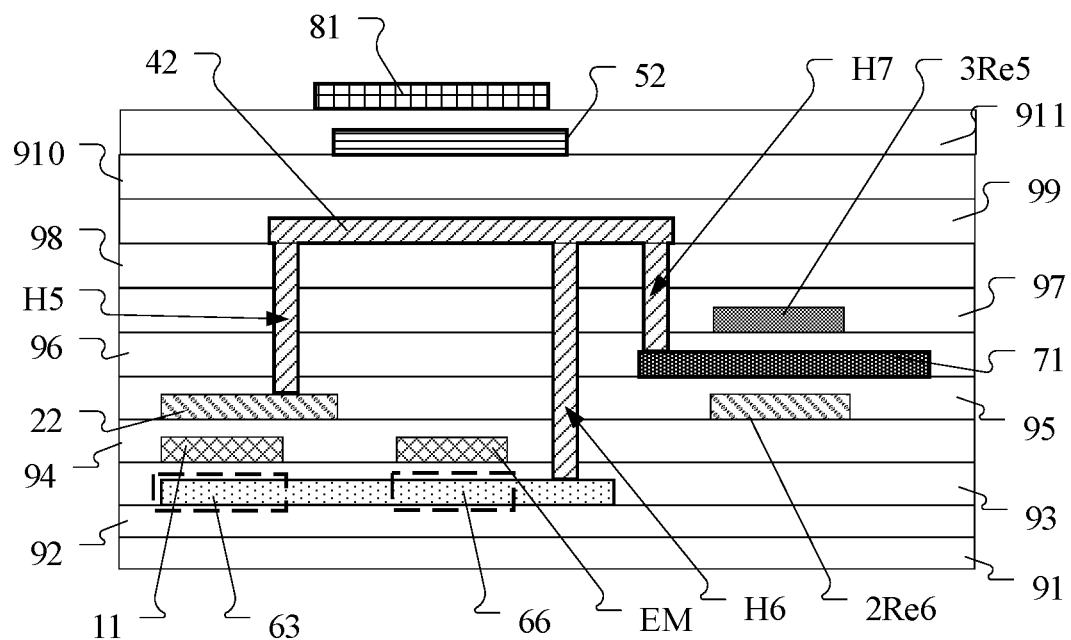
FIG. 38 is a partial cross-sectional view taken along a dotted line AA in FIG. 23.

FIG. 38 is a partial cross-sectional view taken along a dotted line AA in FIG. 23, and as shown in FIG. 38, the pixel driving circuit may further include a buffer layer 92, a first insulating layer 93, a second insulating layer 94, a third insulating layer 95, a fourth insulating layer 96, a first dielectric layer 97, a second dielectric layer 98, a passivation layer 99, a first flat layer 910 and a second flat layer 911. The base substrate 91, the buffer layer 92, the first active layer, the first insulating layer 93, the first conductive layer, the second insulating layer 94, the second conductive layer, the third insulating layer 95, the second active layer, the fourth insulating layer 96, the third conductive layer, the first dielectric layer 97, the second dielectric layer 98, the fourth conductive layer, the passivation layer 99, the first flat layer 910, the fifth conductive layer, the second flat layer 911 and the anode layer are stacked in sequence. The buffer layer 92 may include at least one of a silicon oxide layer and a silicon nitride layer. The first insulating layer 93, the second insulating layer 94, the third insulating layer 95 and the fourth insulating layer 96 may include silicon oxide layers. The first dielectric layer 97 and the second dielectric layer 98 may include silicon nitride layers. Materials of the first flat layer 910 and the second flat layer 911 may include the organic materials such as organic resins, such as polyimide (PI), polyethylene terephthalate (PET), polyethylene naphthalate (PEN), silicon-glass bonding structure (or siliconon-glass) (SOG) and other materials. A material of the passivation layer 99 may include the organic insulating material or the inorganic insulating material. The anode layer may be formed of the indium tin oxide (ITO) material. Materials of the fourth conductive layer and the fifth conductive layer may include the metal materials, such as an alloy or one of molybdenum, aluminum, copper, titanium, and niobium, or a molybdenum/titanium alloy or stacked layer, or a titanium/aluminum/titanium stacked layer. Materials of the first conductive layer, the second conductive layer and the third conductive layer can be an alloy or one of molybdenum, aluminum, copper, titanium and niobium, or a molybdenum/titanium alloy or stacked layer.

In the embodiments of the present disclosure, the display panel may further include a light shield layer, and the light shield layer may be located between the base substrate and the first active layer. An orthographic projection of the light shield layer on the base substrate can at least cover an orthographic projection of the channel area of the driving transistor T3 on the base substrate, and the light shield layer can be configured to reduce the property change of the channel area of the driving transistor affected by the light. In addition, the orthographic projection of the light shield layer on the base substrate can also cover an orthographic projection of a channel area of another transistor on the base substrate. For example, the orthographic projection of the light shield layer on the base substrate can cover orthographic projections of channel areas of all transistors. A material of the light shield layer may be a semiconductor material, a conductor material, or the like. For example, the material of the light shield layer may be amorphous silicon (a-Si), a metal material molybdenum (Mo), and the like. The light shield layer can be coupled to a specific potential, for example, the light shield layer can be coupled to any one or more of the power line VDD and the initial signal line Vinit. This arrangement can not only form the light shield layer into a shielding layer, but also reduce the resistances of the power line VDD and the initial signal line Vinit themselves. The light shield layer may include only a light shield portion extending along the first direction, or only a light shield portion extending along the second direction, or may include both the light shield portion extending along the first direction and the light shield portion extending along the second direction. When the light shield layer includes both the light shield portion extending along the first direction and the light shield portion extending along the second direction, the light shield layer may form the grid structure. When the light shield layer only includes the light shield portion extending in the same direction, an orthographic projection of the light shield portion on the base substrate can form the grid structure with an orthographic projection of another stable signal line on the base substrate, and the light shield portion can be coupled to a stable signal line that intersects the light shield portion through the via hole. This arrangement can reduce the resistance of the stable signal line itself, thereby reducing an IR loading of the stable signal line. The stable signal line can be the power line VDD or the initial signal line Vinit.

In addition, it should be noted that the scale of the drawings in the present disclosure can be used as a reference in an actual process, but is not limited thereto. For example, a width-to-length ratio of a channel, a thickness and spacing of each film layer, a width and spacing of each signal line can be adjusted according to actual needs. The number of pixels in the display substrate and the number of sub-pixels in each pixel are not limited to the numbers shown in the drawings, and the drawings described in the present disclosure are only schematic structural diagrams.

The embodiments of the present disclosure further provide a display device, and the display device includes the above-mentioned display panel. The display device may be a display device such as a mobile phone, a tablet computer, and a TV.

Other embodiments of the present disclosure will be apparent to those skilled in the art after those skilled in the art consider the specification and practice the technical solutions disclosed herein. The present disclosure is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. A pixel driving circuit, comprising:
a driving circuit, coupled to a first node, a second node and a third node, and configured to input a driving current to the third node through the second node according to a signal of the first node;
a control circuit, coupled to a first power terminal, the second node, the third node, a fourth node and an enable signal terminal, and configured to communicate the first power terminal with the second node in response to a signal of the enable signal terminal, and communicate the third node with the fourth node in response to the signal of the enable signal terminal;
a first reset circuit, coupled to the fourth node, a reset signal terminal and an initial signal terminal, and configured to transmit a signal of the initial signal terminal to the fourth node in response to a signal of the reset signal terminal;
a second reset circuit, coupled to the first node, the first power terminal and the reset signal terminal, and configured to transmit a signal of the first power terminal to the first node in response to the signal of the reset signal terminal; and
a coupling circuit, coupled between the first node and the fourth node;
wherein the driving circuit, the control circuit, the first reset circuit and the second reset circuit all comprise transistors, the transistors in the driving circuit, the control circuit, the first reset circuit and the second reset circuit are all N-type transistors, the transistor in the first reset circuit comprises an oxide transistor, and the transistor in the second reset circuit comprises an oxide transistor;
wherein the driving circuit comprises:
a driving transistor, wherein a gate of the driving transistor is coupled to the first node, a first electrode of the driving transistor is coupled to the second node, and a second electrode of the driving transistor is coupled to the third node;
the control circuit comprises:
a fifth transistor, wherein a gate of the fifth transistor is coupled to the enable signal terminal, a first electrode of the fifth transistor is coupled to the first power terminal, and a second electrode of the fifth transistor is coupled to the second node; and a sixth transistor, wherein a gate of the sixth transistor is coupled to the enable signal terminal, a first electrode of the sixth transistor is coupled to the third node, and a second electrode of the sixth transistor is coupled to the fourth node;

the first reset circuit comprises:

a first transistor, wherein a gate of the first transistor is coupled to the reset signal terminal, a first electrode of the first transistor is coupled to the initial signal terminal, and a second electrode of the first transistor is coupled to the fourth node;

the second reset circuit comprises:

a second transistor, wherein a gate of the second transistor is coupled to the reset signal terminal, a first electrode of the second transistor is coupled to the first power terminal, and a second electrode of the second transistor is coupled to the first node;

the coupling circuit comprises:

a capacitor, coupled between the first node and the fourth node;

wherein the driving transistor, the first transistor, the second transistor, the fifth transistor and the sixth transistor are the N-type transistors, and the first transistor and the second transistor are the oxide transistors.

2. The pixel driving circuit according to claim 1, wherein the pixel driving circuit further comprises:

a data writing circuit, coupled to the second node, a data signal terminal and a gate driving signal terminal, and configured to transmit a signal of the data signal terminal to the second node in response to a signal of the gate driving signal terminal; and a threshold compensation circuit, coupled to the third node, the first node and the gate driving signal terminal, and configured to communicate the first node with the third node in response to the signal of the gate driving signal terminal;

wherein the data writing circuit and the threshold compensation circuit both comprise the transistors, and the transistors in the data writing circuit and the threshold compensation circuit are all the N-type transistors.

3. The pixel driving circuit according to claim 2, wherein: the data writing circuit comprises:

a fourth transistor, wherein a gate of the fourth transistor is coupled to the gate driving signal terminal, a first electrode of the fourth transistor is coupled to the data signal terminal, and a second electrode of the fourth transistor is coupled to the second node;

the threshold compensation circuit comprises:

a seventh transistor, wherein a gate of the seventh transistor is coupled to the gate driving signal terminal, a first electrode of the seventh transistor is coupled to the first node, and a second electrode of the seventh transistor is coupled to the third node;

wherein the fourth transistor and the seventh transistor are the N-type transistors.

4. The pixel driving circuit according to claim 2, wherein the transistors in the data writing circuit, the threshold compensation circuit, the control circuit and the driving circuit are N-type low-temperature polycrystalline silicon transistors.

5. A driving method for a pixel driving circuit, configured to drive the pixel driving circuit according to claim 2, wherein the driving method comprises:

in a reset stage, inputting an active level to the reset signal terminal, and inputting an inactive level to the enable signal terminal and the gate driving signal terminal; and in a threshold compensation stage, inputting the active level to the gate driving signal terminal, and inputting the inactive level to the reset signal terminal and the enable signal terminal; and in a light-emitting stage, inputting the inactive level to the reset signal terminal and the gate driving signal terminal, and inputting the active level to the enable signal terminal.

6. The pixel driving circuit according to claim 1, wherein the pixel driving circuit further comprises:

a data writing circuit, coupled to the third node, a data signal terminal and a gate driving signal terminal, and configured to transmit a signal of the data signal terminal to the third node in response to a signal of the gate driving signal terminal; and a threshold compensation circuit, coupled to the second node, the first node and the gate driving signal terminal, and configured to communicate the first node with the second node in response to the signal of the gate driving signal terminal;

wherein the data writing circuit and the threshold compensation circuit both comprise the transistors, and the transistors in the data writing circuit and the threshold compensation circuit are all the N-type transistors.

7. A display panel, wherein the display panel comprises the pixel driving circuit according to claim 1.

8. A driving method for a pixel driving circuit, configured to drive a pixel driving circuit, wherein the pixel driving circuit comprises:

a driving circuit, coupled to a first node, a second node and a third node, and configured to input a driving current to the third node through the second node according to a signal of the first node;

a control circuit, coupled to a first power terminal, the second node, the third node, a fourth node and an enable signal terminal, and configured to communicate the first power terminal with the second node in response to a signal of the enable signal terminal, and communicate the third node with the fourth node in response to the signal of the enable signal terminal;

a first reset circuit, coupled to the fourth node, a reset signal terminal and an initial signal terminal, and configured to transmit a signal of the initial signal terminal to the fourth node in response to a signal of the reset signal terminal;

a second reset circuit, coupled to the first node, the first power terminal and the reset signal terminal, and configured to transmit a signal of the first power terminal to the first node in response to the signal of the reset signal terminal; and a coupling circuit, coupled between the first node and the fourth node;

wherein the driving circuit, the control circuit, the first reset circuit and the second reset circuit all comprise transistors, the transistors in the driving circuit, the control circuit, the first reset circuit and the second reset circuit are all N-type transistors, the transistor in the first reset circuit comprises an oxide transistor, and the transistor in the second reset circuit comprises an oxide transistor;

wherein the driving circuit comprises:

a driving transistor, wherein a gate of the driving transistor is coupled to the first node, a first electrode of the driving transistor is coupled to the second node, and a second electrode of the driving transistor is coupled to the third node;

the control circuit comprises:

a fifth transistor, wherein a gate of the fifth transistor is coupled to the enable signal terminal, a first electrode of the fifth transistor is coupled to the first power terminal, and a second electrode of the fifth transistor is coupled to the second node; and a sixth transistor, wherein a gate of the sixth transistor is coupled to the enable signal terminal, a first electrode of the sixth transistor is coupled to the third node, and a second electrode of the sixth transistor is coupled to the fourth node;

the first reset circuit comprises:

a first transistor, wherein a gate of the first transistor is coupled to the reset signal terminal, a first electrode of the first transistor is coupled to the initial signal terminal, and a second electrode of the first transistor is coupled to the fourth node;

the second reset circuit comprises:

a second transistor, wherein a gate of the second transistor is coupled to the reset signal terminal, a first electrode of the second transistor is coupled to the first power terminal, and a second electrode of the second transistor is coupled to the first node;

the coupling circuit comprises:

a capacitor, coupled between the first node and the fourth node;

wherein the driving transistor, the first transistor, the second transistor, the fifth transistor and the sixth transistor are the N-type transistors, and the first transistor and the second transistor are the oxide transistors;

wherein the driving method comprises:

in a reset stage, inputting an active level to the reset signal terminal, and inputting an inactive level to the enable signal terminal; and in a light-emitting stage, inputting the inactive level to the reset signal terminal, and inputting the active level to the enable signal terminal.

9. A display panel, wherein the display panel comprises a light-emitting unit and a pixel driving circuit configured to drive the light-emitting unit, and the pixel driving circuit comprising:

a driving transistor;

a first transistor, wherein a first electrode of the first transistor is coupled to an initial signal line, and a second electrode of the first transistor is coupled to a first electrode of the light-emitting unit;

a second transistor, wherein a first electrode of the second transistor is coupled to a power line, and a second electrode of the second transistor is coupled to a gate of the driving transistor;

a fifth transistor, wherein a gate of the fifth transistor is coupled to an enable signal line, a first electrode of the fifth transistor is coupled to the power line, and a second electrode of the fifth transistor is coupled to a first electrode of the driving transistor;

a sixth transistor, wherein a gate of the sixth transistor is coupled to the enable signal line, a first electrode of the sixth transistor is coupled to a second electrode of the driving transistor, and a second electrode of the sixth transistor is coupled to the first electrode of the light-emitting unit;

a fourth transistor, wherein a gate of the fourth transistor is coupled to a gate driving signal line, a first electrode of the fourth transistor is coupled to a data line, and a second electrode of the fourth transistor is coupled to the first electrode of the driving transistor;

a seventh transistor, wherein a gate of the seventh transistor is coupled to the gate driving signal line, a first electrode of the seventh transistor is coupled to the gate of the driving transistor, and a second electrode of the seventh transistor is coupled to the second electrode of the driving transistor; and a capacitor, wherein a first electrode of the capacitor is coupled to the gate of the driving transistor, and a second electrode of the capacitor is coupled to the second electrode of the sixth transistor;

wherein the driving transistor, the first transistor, the second transistor, the fifth transistor, the sixth transistor, the fourth transistor and the seventh transistor are N-type transistors, and the first transistor and the second transistor are oxide transistors.

10. The display panel according to claim 9, wherein the display panel further comprises:

a base substrate;

a first active layer, located on a side of the base substrate, wherein the first active layer comprises a third active portion, a fourth active portion, a fifth active portion, a sixth active portion and a seventh active portion;

wherein the third active portion is configured to form a channel area of the driving transistor, the fourth active portion is configured to form a channel area of the fourth transistor, the fifth active portion is configured to form a channel area of the fifth transistor, the sixth active portion is configured to form a channel area of the sixth transistor, and the seventh active portion is configured to form a channel area of the seventh transistor;

a first conductive layer, located on a side of the first active layer away from the base substrate, wherein the first conductive layer comprises a first conductive portion, the gate driving signal line and the enable signal line;

wherein an orthographic projection of the third active portion on the base substrate is covered by an orthographic projection of the first conductive portion on the base substrate, the first conductive portion is configured to form the gate of the driving transistor, and an orthographic projection of the gate driving signal line on the base substrate and an orthographic projection of the enable signal line on the base substrate are extended along a first direction; and a second active layer, located on a side of the first conductive layer away from the base substrate, wherein the second active layer comprises a first active portion and a second active portion, the first active portion is configured to form a channel area of the first transistor, and the second active portion is configured to form a channel area of the second transistor.

11. The display panel according to claim 10, wherein the first conductive layer is further configured to form the first electrode of the capacitor, and the display panel further comprises:

a second conductive layer, located between the first conductive layer and the second active layer, wherein the second conductive layer comprises a second conductive portion, an orthographic projection of the second conductive portion on the base substrate is at least partially overlapped with the orthographic projection of the first conductive portion on the base substrate, and the second conductive portion is configured to form the second electrode of the capacitor.

12. The display panel according to claim 11, wherein the orthographic projection of the first conductive portion on the base substrate is located between the orthographic projection of the gate driving signal line on the base substrate and the orthographic projection of the enable signal line on the base substrate;
- an orthographic projection of the first active portion on the base substrate is located on a side of the orthographic projection of the enable signal line on the base substrate away from the orthographic projection of the first conductive portion on the base substrate, and an orthographic projection of the second active portion on the base substrate is located on a side of the orthographic projection of the gate driving signal line on the base substrate away from the orthographic projection of the first conductive portion on the base substrate;
- the display panel further comprises:
- a third conductive layer, located on a side of the second active layer away from the base substrate, wherein the third conductive layer comprises a first reset signal line and a second reset signal line;
- wherein an orthographic projection of the first reset signal line on the base substrate is extended along the first direction, the orthographic projection of the first active portion on the base substrate is covered by the orthographic projection of the first reset signal line on the base substrate, and a partial structure of the first reset signal line is configured to form a first gate of the first transistor; and
- wherein an orthographic projection of the second reset signal line on the base substrate is extended along the first direction, the orthographic projection of the second active portion on the base substrate is covered by the orthographic projection of the second reset signal line on the base substrate, and a partial structure of the second reset signal line is configured to form a first gate of the second transistor.

13. The display panel according to claim 12, wherein the display panel further comprises:
- a second conductive layer, located between the first conductive layer and the second active layer, wherein the second conductive layer comprises a third reset signal line and a fourth reset signal line;
- wherein an orthographic projection of the third reset signal line on the base substrate is extended along the first direction, the orthographic projection of the first active portion on the base substrate is covered by the orthographic projection of the third reset signal line on the base substrate, and a partial structure of the third reset signal line is configured to form a second gate of the first transistor; and
- wherein an orthographic projection of the fourth reset signal line on the base substrate is extended along the first direction, the orthographic projection of the second active portion on the base substrate is covered by the orthographic projection of the fourth reset signal line on the base substrate, and a partial structure of the fourth reset signal line is configured to form a second gate of the second transistor.

14. The display panel according to claim 10, wherein an orthographic projection of the first active portion on the base substrate and an orthographic projection of the second active portion on the base substrate are both located on a side of the orthographic projection of the enable signal line on the base substrate away from the orthographic projection of the first conductive portion on the base substrate;
- the display panel further comprises:
- a third conductive layer, located a side of the second active layer away from the base substrate, wherein the third conductive layer comprises a fifth reset signal line;
- wherein an orthographic projection of the fifth reset signal line on the base substrate is extended along the first direction, the orthographic projection of the first active portion on the base substrate and the orthographic projection of the second active portion on the base substrate are covered by the orthographic projection of the fifth reset signal line on the base substrate, a partial structure of the fifth reset signal line is configured to form a first gate of the first transistor, and another partial structure of the fifth reset signal line is configured to form a first gate of the second transistor.

15. The display panel according to claim 14, wherein the display panel further comprises:
- a fourth conductive layer, located on a side of the third conductive layer away from the base substrate, wherein the fourth conductive layer comprises the data line;
- wherein in the first direction, the orthographic projection of the second active portion on the base substrate is located between an orthographic projection of the data line on the base substrate and the orthographic projection of the first active portion on the base substrate.

16. The display panel according to claim 10, wherein the display panel further comprises:
- a third conductive layer, located on a side of the second active layer away from the base substrate; and
- a fourth conductive layer, located on a side of the third conductive layer away from the base substrate, wherein the fourth conductive layer comprises the data line and the power line;
- wherein an orthographic projection of the data line on the base substrate and an orthographic projection of the power line on the base substrate are extended along a second direction that is intersected with the first direction, and the orthographic projection of the power line on the base substrate is located between the orthographic projection of the data line on the base substrate and the orthographic projection of the first conductive portion on the base substrate.

17. The display panel according to claim 10, wherein the display panel further comprises:
- a third conductive layer, located on a side of the second active layer away from the base substrate; and
- a fifth conductive layer, located on a side of the third conductive layer away from the base substrate, wherein the fifth conductive layer comprises the initial signal line;
- wherein a sheet resistance of the fifth conductive layer is smaller than a sheet resistance of the third conductive layer.

18. The display panel according to claim 17, wherein an orthographic projection of the first active portion on the base substrate and an orthographic projection of the second active portion on the base substrate are covered by an orthographic projection of the initial signal line on the base substrate.

19. The display panel according to claim 17, wherein the orthographic projection of the first conductive portion on the base substrate is covered by an orthographic projection of the initial signal line on the base substrate.

* * * * *

UNITED STATES PATENT AND TRADEMARK OFFICE
CERTIFICATE OF CORRECTION

PATENT NO. : 12,307,964 B2
APPLICATION NO. : 17/914386
DATED : May 20, 2025
INVENTOR(S) : Wang et al.

Page 1 of 1

It is certified that error appears in the above-identified patent and that said Letters Patent is hereby corrected as shown below:

On the Title Page

The second Assignee(s) in item (73):
BOE TECHNOLOGIES GROUP CO., LTD. should read ---BOE TECHNOLOGY GROUP CO., LTD.---.

Signed and Sealed this
First Day of July, 2025

Coke Morgan Stewart
*Acting Director of the United States Patent and Trademark Office*